US 6,611,035 B2

(12) United States Patent
Inoue

(10) Patent No.: US 6,611,035 B2
(45) Date of Patent: Aug. 26, 2003

(54) FERRITE MAGNETIC FILM STRUCTURE HAVING MAGNETIC ANISOTROPY, METHOD OF MANUFACTURING THE SAME, AND PLANAR MAGNETIC DEVICE EMPLOYING FERRITE MAGNETIC FILM STRUCTURE HAVING MAGENETIC ANISOTROPY

(75) Inventor: Tetsuo Inoue, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/985,760

(22) Filed: Nov. 6, 2001

(65) Prior Publication Data

US 2002/0048668 A1 Apr. 25, 2002

Related U.S. Application Data

(60) Continuation of application No. 09/594,551, filed on Jun. 15, 2000, which is a division of application No. 09/152,246, filed on Sep. 11, 1998, now Pat. No. 6,136,458.

(30) Foreign Application Priority Data

Sep. 13, 1997 (JP) .............................................. 9-268104
Jan. 23, 1998 (JP) .............................................. 10-11288

(51) Int. Cl.$^7$ .............................................. H01L 43/00
(52) U.S. Cl. ........................ 257/421; 257/528; 257/275
(58) Field of Search ................................ 257/421, 258, 257/275, 351, 528; 428/693; 427/116, 129, 275

(56) References Cited

U.S. PATENT DOCUMENTS

| 4,987,009 | A | 1/1991 | Nakamura et al. |
| 5,051,970 | A | 9/1991 | Ishii et al. |
| 5,647,966 | A | 7/1997 | Uriu et al. |
| 5,698,131 | A | 12/1997 | Saitou et al. |
| 5,966,063 | A | 10/1999 | Sato et al. |
| 6,136,458 | A | * 10/2000 | Inoue .......................... 428/493 |
| 6,323,533 | B1 | * 11/2001 | Van Der Zaag et al. .... 257/528 |
| 6,335,050 | B1 | * 1/2002 | Inoue .......................... 427/116 |
| 6,414,564 | B1 | 7/2002 | Mizoguchi et al. |

FOREIGN PATENT DOCUMENTS

| JP | 56-169309 | 12/1981 |
| JP | 1-173702 | 7/1989 |
| JP | 06166833 | 6/1994 |
| JP | 6-290950 | 10/1994 |
| JP | 07022265 | 1/1995 |
| JP | 9-186037 | 9/1997 |

* cited by examiner

Primary Examiner—David Nelms
Assistant Examiner—Thinh Nguyen
(74) Attorney, Agent, or Firm—Oblon, Spivak, McClelland, Maier & Neustadt, P.C.

(57) ABSTRACT

A ferrite magnetic film structure exhibiting a magnetic anisotropy, the ferrite magnetic film structure comprising, a substrate provided on one main surface thereof with a groove-like recessed portion and with a ridge-like projected portion located neighboring to the groove-like recessed portion, and a ferrite magnetic film constituted by a continuous film having a substantially flat upper surface and formed on one main surface of the substrate, wherein the ferrite magnetic film structure meets the following conditions:

$$(a/(a+b))(h/(t-h)) \geq 0.047$$

$$1 \geq (a+b)$$

where "a" is a width of the ridge-like projected portion, b is a width of the groove-like recessed portion, h is a height of step between the groove-like recessed portion and the ridge-like projected portion, t is a thickness of the ferrite magnetic film at the recessed portion, and 1 is a length of the recessed portion and of the projected portion.

14 Claims, 16 Drawing Sheets

FERRITE MAGNETIC FILM STRUCTURE HAVING MAGNETIC ANISOTROPY, METHOD OF MANUFACTURING THE SAME, AND PLANAR MAGNETIC DEVICE EMPLOYING FERRITE MAGNETIC FILM STRUCTURE HAVING MAGENETIC ANISOTROPY

BACKGROUND OF THE INVENTION

This invention relates to a ferrite magnetic film structure which has a magnetic anisotropy in an optional direction and is capable of continuously changing the direction of magnetic anisotropy, to a method of manufacturing the ferrite magnetic film structure, and to a planar magnetic device employing a ferrite magnetic film structure having a magnetic anisotropy.

In recent years, electronic devices of various kinds are increasing miniaturized, resulting in a trend to manufacture various electronic devices by making use of a thin film process. In this trend, magnetic devices such as an inductor, a transformer and a magnetic head are now developed in the form of planar magnetic devices such as those of shell type structure where a planar coil formed on a substrate is covered with a magnetic film, or those where green sheets are laminated and then baked.

In these planar type magnetic devices, the coil is manufactured by making use of a liquid phase deposition method such as an electrolytic plating method, or a vapor deposition method such as a sputtering method and a vacuum vapor deposition method. On the other hand, a magnetic film is manufactured by making use of vapor deposition method such as a sputtering method and a vacuum vapor deposition method, or a method of coating a dispersed solution of magnetic material in a resin. Alternatively, a magnetic film is manufactured by making use of a film-like coil and a film-like magnetic film to be obtained through quenching of a magnetic material from a high temperature.

In the latter method, the thickness of a thin film magnetic device inevitably becomes as thick as about 1 mm. Moreover, since the electric contact thereof with an external member cannot be achieved in the same manner as that of a semiconductor component, there is a limit in thinning or miniaturizing a device composed of a combination of a thin film magnetic device and another semiconductor component.

On the other hand, the former method is advantageous in the respect that the thinning of a thin film magnetic device can be easily realized and that a thin film magnetic device can be mounted in the same manner as in the case of a semiconductor component. However, the thinning in thickness of a magnetic film to be manufactured by making use of a vapor phase growth method is limited in view of mass productivity and stress. Additionally, the former method is accompanied with a drawback in that, due to the phenomenon that the magnetic film is magnetically saturated, the characteristics such as current capacity are subjected to limitation.

In view of overcoming these problems, there is now adopted, in the formation of a magnetic film, a method of forming a ferrite layer by means of a wet plating method (Japanese Patent Unexamined Publication S/63-268210) or by making use of a resin film (Japanese Patent Unexamined Publication H/1-173702).

Further, since the ratio of core loss due to magnetizing hysteresis becomes higher as the signal frequency to be handled becomes higher, there is now increasingly required not to employ the magnetization mode of axis of easy magnetization but to employ the magnetization mode of hard axis.

When a magnetic film is desired to employed under a high frequency, it is required to provide the magnetic film with a magnetic anisotropy so as to avoid a magnetic resonance such as ferromagnetic resonance and to obtain stable frequency characteristics. An amorphous magnetic material and a metallic magnetic film which exhibits structural relaxation at the occasion of heat treatment can be provided with uni-axial anisotropy in any optional direction by heat-treating them after the formation of magnetic film. With a magnetic device using these materials, it is possible to realize an excellent magnetic characteristic exhibiting minimal loss in a magnetic rotational mode by providing the magnetic film with the uni-axial anisotropy, and subsequently performing the magnetization of hard axis.

However, it is difficult in the case of an oxide magnetic material such as ferrite to provide the magnetic material with magnetic anisotropy by means of heat treatment after the formation of a magnetic film. Accordingly, there is a problem that the magnetic material cannot be used in an MHz (mega Hertz) band since the L value thereof is greatly influenced by the frequency to be employed and the resonance frequency thereof is relatively low.

In an attempt to overcome this problem, there has been proposed a structure as shown in FIG. 1 wherein an insulating body 3 is formed on the surface of a substrate 2 in such a manner that a projected stripe pattern is formed on the surface of the insulating body 3, and a magnetic film 1 is formed on the recessed and projected surface of the insulating body 3. It is possible with this structure to provide the magnetic film 1 with magnetic anisotropy in a specific direction on the substrate 1 (Japanese Patent Unexamined Publication S/56-169309).

However, this proposed structure inherently does not take into account the configuration of magnetic film to be formed with a ferrite material by means of a printing method, which is featured in that the resultant magnetic film is continuous thus making the upper surface thereof approximately flat. Therefore, there is still a problem that it is impossible to provide the flat surface of magnetic film with anisotropy in a desired direction.

There is a problem when a magnetic body is formed into a stripe pattern that the dimension of the pattern is extremely restricted. Further, the easy direction of magnetization prevails in the region where the magnetic film is connected with the coil exhibits, but the hard direction of magnetization prevails in another region, so that it has been impossible to obtain a sufficient effect of anisotropy, thus failing to sufficiently dissolve the problem of frequency dependency of the L value.

As explained above, since it is impossible to employ a ferrite magnetic film having a magnetic anisotropy in a desired direction, the planar magnetic device having a sufficient effect of anisotropy cannot be obtained and hence it has been difficult to employ the planar magnetic device at a high frequency region. On the other hand, in the case where a metallic magnetic film or an amorphous magnetic film is to be employed, it is difficult to sufficiently increase the film thickness, and to avoid a magnetic saturation, thus restricting the electric current to be passed to a magnetic device.

BRIEF SUMMARY OF THE INVENTION

An object of the present invention is to provide a ferrite magnetic film structure which is capable of exhibiting a sufficiently large magnetic anisotropy, continuously changing the direction of magnetic anisotropy in the magnetic film thereof, and exhibiting a stable magnetic property without giving rise to resonance in a high frequency zone of MHz or more.

Another object of the present invention is to provide a method of manufacturing a ferrite magnetic film structure having such features as mentioned above.

A still another object of the present invention is to provide a planar magnetic device provided with a ferrite magnetic film structure having such features as mentioned above.

Namely, according to the present invention, there is provided a ferrite magnetic film structure exhibiting a magnetic anisotropy, the ferrite magnetic film structure comprising;
 a substrate provided on one main surface thereof with a groove-like recessed portion and with a ridge-like projected portion located neighboring to the groove-like recessed portion; and
 a ferrite magnetic film constituted by a continuous film having a substantially flat upper surface and formed on one main surface of the substrate;
 wherein the ferrite magnetic film structure meets the following conditions:

$$(a/(a+b))(h/(t-h)) \geq 0.047.$$

$$1 \geq (a+b)$$

where "a" is a width of the ridge-like projected portion; b is a width of the groove-like recessed portion; h is a height of step between the groove-like recessed portion and the ridge-like projected portion; t is a thickness of the ferrite magnetic film at the recessed portion; and 1 is a length of the recessed portion and of the projected portion.

According to the present invention, there is further provided a ferrite magnetic film structure exhibiting a magnetic anisotropy, the ferrite magnetic film structure comprising;
 a substrate; and
 a ferrite magnetic film formed on one main surface of the substrate and having a spiral pattern or a concentric pattern;
 wherein the ferrite magnetic film structure meets the following conditions:

$$u^2/(w^2+u^2) \geq 0.12 \times 10^{-3}$$

where w is a width of the ferrite magnetic film; and u is a thickness of the ferrite magnetic film.

According to the present invention, there is further provided a method of manufacturing a ferrite magnetic film structure exhibiting a magnetic anisotropy, the method comprising the steps of;
 forming a groove-like recessed portion and a ridge-like projected portion on one main surface of a substrate;
 forming a ferrite paste layer by coating a paste containing a ferrite powder on the one main surface; and
 baking the ferrite paste to form a ferrite magnetic film constituted by a continuous film having a substantially flat upper surface.

According to the present invention, there is further provided a planar magnetic device comprising;
 a first ferrite magnetic film structure exhibiting a magnetic anisotropy;
 a second ferrite magnetic film structure exhibiting a magnetic anisotropy; and
 a planar coil conductor interposed between the first ferrite magnetic film structure and the second ferrite magnetic film structure;
 wherein each of the first and second ferrite magnetic film structures comprise;
 a substrate provided on one main surface thereof with a groove-like recessed portion and with a ridge-like projected portion located neighboring to the groove-like recessed portion; and
 a ferrite magnetic film constituted by a continuous film having a substantially flat upper surface and formed on one main surface of the substrate;
 wherein the ferrite magnetic film structure meets the following conditions:

$$(a/(a+b))(h/(t-h)) \geq 0.047$$

$$1 \geq (a+b)$$

where "a" is a width of the ridge-like projected portion; b is a width of the groove-like recessed portion; h is a height of step between the groove-like recessed portion and the ridge-like projected portion; t is a thickness of the ferrite magnetic film at the recessed portion; and 1 is a length of the recessed portion and of the projected portion.

According to the present invention, there is further provided a planar magnetic device comprising;
 a first ferrite magnetic film structure exhibiting a magnetic anisotropy;
 a second ferrite magnetic film structure exhibiting a magnetic anisotropy; and
 a planar coil conductor interposed between the first ferrite magnetic film structure and the second ferrite magnetic film structure;
 wherein each of the first and second ferrite magnetic film structures comprise;
 a substrate; and
 a ferrite magnetic film formed on one main surface of the substrate and having a spiral pattern or a concentric pattern;
 wherein the ferrite magnetic film structure meets the following conditions:

$$u^2/(w^2+u^2) \geq 0.12 \times 10^{-3}$$

where w is a width of the ferrite magnetic film; and u is a thickness of the ferrite magnetic film.

According to the present invention, there is further provided a planar magnetic device comprising;
 a substrate;
 a magnetic film formed on the substrate and exhibiting a magnetic anisotropy; and
 a planar coil conductor formed on the magnetic film;
 wherein the magnetic film is provided with uniaxial magnetic anisotropy in an in-plane direction of the substrate so as to allow an extending direction of the planar coil conductor to be maintained parallel with easy direction of magnetization, and the entire surface of the magnetic film exhibits hard magnetization against a coil current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The magnetic film structure exhibiting a magnetic anisotropy is featured in that a groove, a spiral recessed portion or a concentric recessed portion is formed on the surface of a substrate, and then a ferrite magnetic film is formed on the surface of the substrate by means of a thick film-forming method such as a printing method, thereby forming the ferrite magnetic film into a spiral or concentric configuration in the groove or recessed portion. As a result, the magnetic anisotropy in plane of the film can be specified in a spiral or concentric direction, thus making it possible to provide the ferrite magnetic film with a sufficiently large magnetic anisotropy.

Moreover, when a ferrite magnetic film provided with a shape anisotropy (spiral or concentric shape) is formed to a thick film by means of printing method for instance, it is possible to obtain a planar magnetic device to be used at a high frequency region of MHz or more by making use of a ferrite material which has been conventionally deemed difficult to provide with magnetic anisotropy.

The planar magnetic device according to this invention is featured in that is comprises a substrate, a magnetic film formed on the substrate and exhibiting a magnetic anisotropy, and a planar coil conductor formed on said magnetic film; wherein the magnetic film is provided with uniaxial magnetic anisotropy which is continuously and optionally set in an in-plane direction of the substrate so as to allow an extending direction of the planar coil conductor to be maintained parallel with easy direction of magnetization, and the entire surface of said magnetic film exhibits hard magnetization against a coil current.

Since it is possible according to this invention to provide a ferrite magnetic film with a sufficiently large magnetic anisotropy, the ferrite magnetic film will exhibit a stable magnetic property without giving rise to the generation of resonance in a high frequency region of MHz or more.

Further, it is possible according to this invention to obtain a planar magnetic device to be used at a high frequency region of MHz or more by making use of a ferrite material which has been conventionally deemed difficult to provide with magnetic anisotropy. Furthermore, since a thick film can be employed, it is possible to inhibit a magnetic saturation that may be generated at the occasion of passing an electric current to the coil, thus ensuring a stable device characteristic even when a relatively large coil current is employed.

This invention will be now explained with reference to drawings illustrating various embodiments of this invention.

Figure 1:
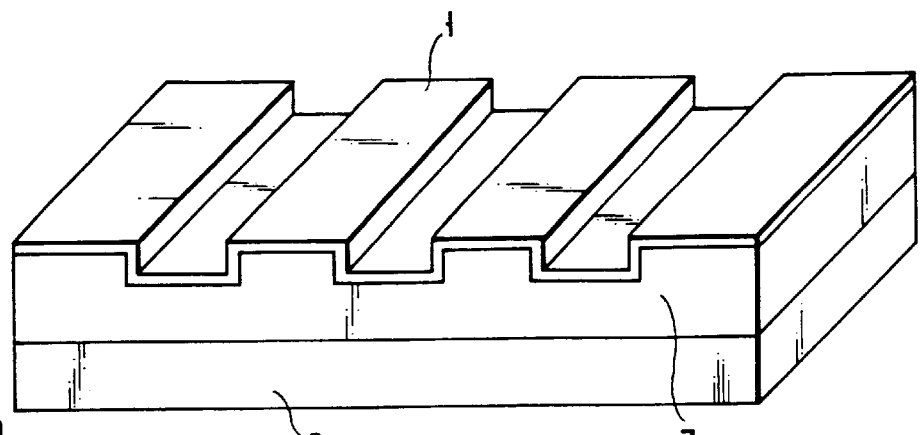
FIG. 1 is a perspective view illustrating a conventional magnetic body exhibiting a shape magnetic anisotropy.
Figure 2:
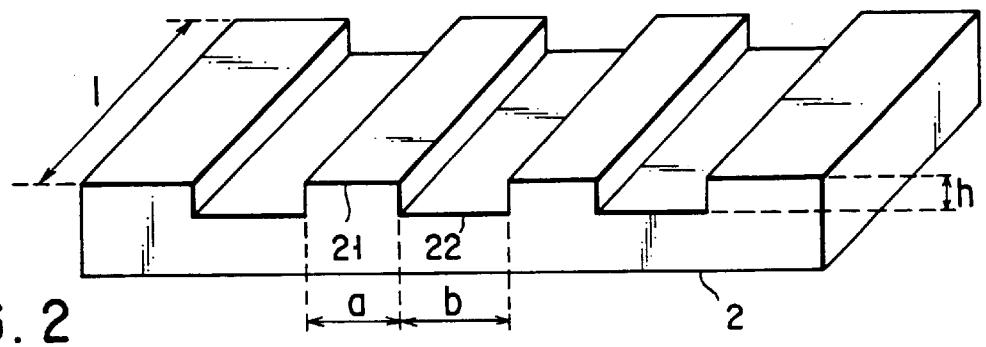
FIG. 2 is a perspective view illustrating a substrate of magnetic film structure according to a first embodiment of this invention.
Figure 3A:
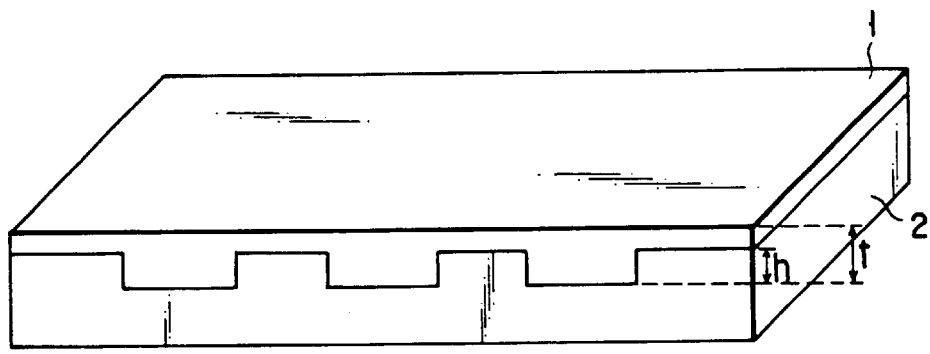
FIG. 3A is a perspective view illustrating a ferrite magnetic film structure according to a first embodiment of this invention.
Figure 3B:
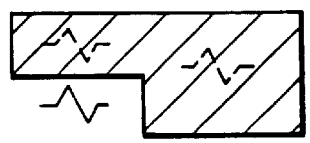
FIG. 3B is a partial sectional view of the ferrite magnetic film shown in FIG. 3A.

First of all, a first embodiment of this invention will be explained with reference to FIGS. 2 and 3A to 3C, wherein FIG. 2 is a perspective view of a substrate of ferrite magnetic film structure according to a first embodiment of this invention; FIG. 3A is a perspective view of a ferrite magnetic film structure according to a first embodiment of this invention; FIG. 3B is a partial sectional view of the ferrite magnetic film shown in FIG. 3A; and FIG. 3C is an equivalent circuit diagram of magnetic resistance of the ferrite magnetic film structure shown in FIG. 3A.

As shown in FIGS. 2 and 3A, a plurality of grooves arranged parallel with each other are formed on the upper surface of a substrate 2. In these FIGURES, the width of the recessed portion formed on the upper surface of the substrate 2 is defined as "b", the width of the projected portion is defined as "a", and the height of step between the recessed portion and the projected portion is defined as "h". As shown in FIG. 3A, a ferrite magnetic film 1 having a saturated magnetic flux density Bs and a magnetic permeability $\mu$ is formed on the recessed and projected upper surface of the substrate 2 by means of a printing method. The thickness "t" at the recessed portion of the magnetic film 1 is set such that the magnetic film 1 is formed continuously and that the upper surface of the magnetic film 1 becomes substantially flat.

As for the ferrite material, Mn—Zn ferrite, Ni—Zn ferrite or Cu—Ni—Zn ferrite may be employed. However, this invention is not limited to these ferrite materials.

Figure 3C:
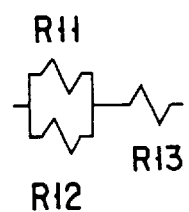
FIG. 3C is an equivalent circuit diagram of magnetic resistance of the ferrite magnetic film structure shown in FIG. 3A.

When the length "1" of groove is much larger than (a+b), i.e. (1>>(a+b)), the magnetic circuit in the direction perpendicular to the extending direction of the groove is shown in FIG. 3C. Further, when the magnetic resistance of the portion of ferrite magnetic film on the projected portion of substrate 2 is represented by R11, the magnetic resistance of the projected portion of substrate 2 is represented by R12, and the magnetic resistance of the portion of ferrite magnetic film on the recessed portion of substrate 2 is represented by R13, these magnetic resistances R11, R12 and R13 can be expressed as follows.

$$R11=a/(g(t-h))$$

$$R12=a/\mu_0 h$$

$$R13=b/\mu t$$

Since $\mu>>\mu_0$, the magnetic resistance Rv per unit length of the magnetic film in the direction perpendicular to the extending direction of the groove can be expressed as follows.

$$Rv=(a/(\mu(t-h))+b/\mu t)/(a+b)$$

On the other hand, the magnetic resistance Rh per unit length of the magnetic film in the direction parallel to the extending direction of the groove can be expressed as follows.

$$Rh=(a+b)/(\mu((a+b)t-ah))$$

Further, the magnetomotive force Vmv in the direction perpendicular to the extending direction of the groove and the magnetomotive force Vmh in the direction parallel to the extending direction of the groove, which are required for saturating the magnetic film in each direction, can be expressed as follows.

$$Vmv=Bs \cdot t(a/(\mu(t-h))+b/\mu t)/(a+b)$$

$$Vmh=Bs/\mu$$

wherein an effective cross-sectional area perpendicular to the extending direction of groove is defined as 1·t; and an effective cross-sectional area parallel to the extending direction of groove is defined as [(a+b)t−bt]/(a+b).

When Vmv−Vmh is defined as an anisotropic magnetic field Ha in this case, Ha can be expressed as follows.

$$Ha = Vmv - Vmh,$$
$$= Bs/\mu \cdot (t \cdot (a/(t-h)+b/t)/(a+b) - 1,$$
$$= Bs/\mu \cdot (ah/((t-h)(a+b)))$$

By the way, in order to render the aforementioned magnetic film structure to be useful in the MHz band, the ferromagnetic resonance frequency of the magnetic film structure is required to set to 10 MHz or more (2 to 10 times as large as the frequency to be used). Namely, when the resonance frequency is represented by fr, it can be expressed as follows.

$$fr=(Ha/2\pi)\upsilon \geq 1\times 10^7,$$

$$Ha \geq (2\pi/\upsilon \cdot g) \times 1 \times 10^7$$

wherein $\upsilon$ is a gyromagnetic ratio, and g (g factor) is defined as about 2.

Therefore, Ha is required to meet the condition of $Ha \geq 3 \times 10^2$ [A/m]. Namely, Ha is required to meet the condition of $Bs/\mu \cdot (ah/((t-h)(a+b))) \geq 3 \times 10^2$. If ferrite materials of various kinds meet the condition of $ah/((t-h)(a+b)) \geq 0.047$, they can be employed stably at the MHz region. In this case, Bs is set to about 0.4 T or less and $\mu r$ (relative magnetic permeability) was set to 500 or more ($Bs/\mu \leq 0.008$).

When the condition of $Bs/\mu \cdot (ah/((t-h)(a+b))) \geq 3 \times 10^2$ is satisfied, the anisotropic magnetic field Ha due to shape becomes smaller than $3 \times 10^2$ [A/m]. Where the printed ferrite magnetic film is baked in a non-magnetic field, the crystal magnetic anisotropy becomes zero. For that reason, the total anisotropy of the formed ferrite magnetic film becomes smaller than $3 \times 10^2$ [A/m]. When the anisotropy becomes small, the ferromagnetic resonance frequency becomes small. Therefore, a usable frequency is limited.

When Ha is smaller than $3 \times 10^2$ [A/m], the ferromagnetic resonance frequency of the ferrite magnetic film becomes less than 10 MHz [A/m]. Accordingly, when magnetic parts are mass-produced and the operating frequency of the magnetic parts are set to MHz frequency range, deterioration and fluctuation of the characteristics becomes large. Thus, it is not suitable to use in the MHz frequency range.

Typical characteristics of soft ferrite are represented in the following table.

| | $\mu r$ | Bs | $Bs/\mu r$ ($\leq 0.008$) |
|---|---|---|---|
| Mn—Zn ferrite | 5000 | 0.42 | 0.000084 |
| | 2000 | 0.35 | 0.00175 |

-continued

|  | μm | Bs | Bs/μr (≦0.008) |
|---|---|---|---|
|  | 1000 | 0.35 | 0.00035 |
| Ni—Zn ferrite | 70 | 0.27 | 0.0038 |

As explained above, the ferrite magnetic film structure exhibiting magnetic anisotropy according to this invention is featured in that it comprises a substrate provided on the surface thereof with a groove-like recessed portion and with a projected portion which are arranged side by side and directed in a predetermined direction; and a ferrite magnetic film which is continuously formed on the aforementioned recessed and projected surface of substrate and has a substantially flat upper surface; and in that said ferrite magnetic film structure meets the following conditions:

$$(a/(a+b))(h/(t-h)) \geq 0.047 \quad (1)$$

$$1 \geq (a+b) \quad (2)$$

where "a" is a width of the projected portion; b is a width of the recessed portion; h is a height of step between the recessed portion and the projected portion; t is a thickness of the ferrite magnetic film at the recessed portion; and 1 is a length of the recessed portion.

If a ferrite magnetic film structure meets the aforementioned formulas (1) and (2), it is possible to provide the ferrite magnetic film with a sufficiently large anisotropy, so that the ferrite magnetic film structure according to this invention can exhibit a stable magnetic property without giving rise to the generation of resonance at a high frequency region of MHz or more.

Figure 4A:
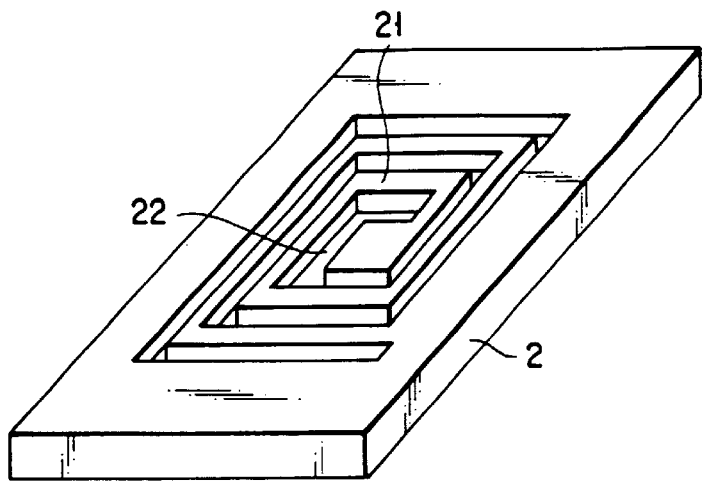
FIGS. 4A and 4B are perspective views of a substrate of ferrite magnetic film structure and of ferrite magnetic film structure respectively, illustrating a second embodiment of this invention.
Figure 4B:
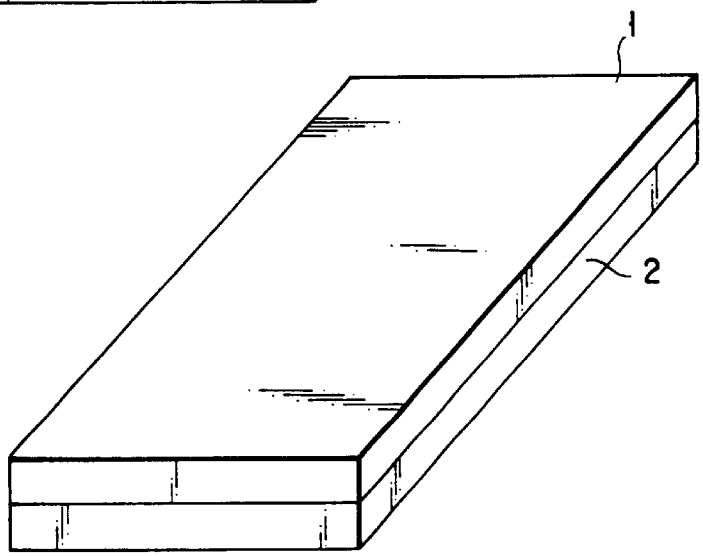
Figure 5:
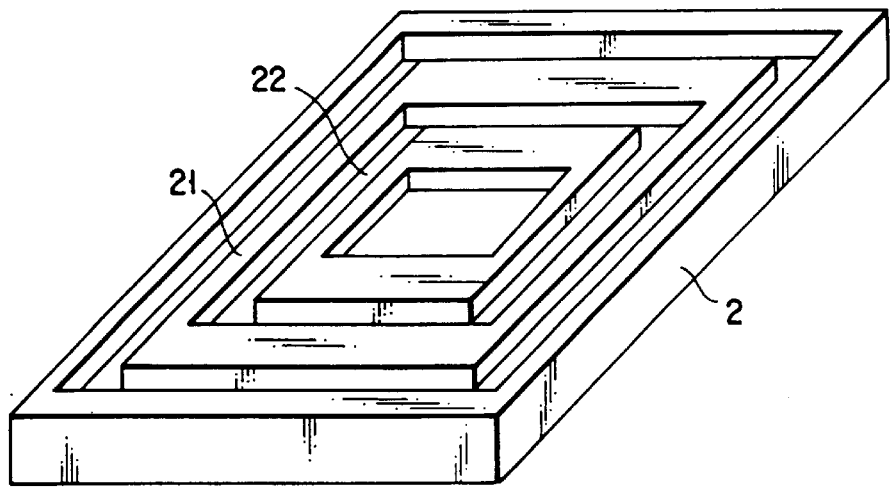
FIG. 5 is a perspective view illustrating a substrate of ferrite magnetic film structure according to another example of this invention.

Next, the ferrite magnetic film structure according to a second embodiment of this invention will be explained with reference to FIGS. 4A, 4B and 5, wherein FIG. 4A is a perspective view of a substrate of ferrite magnetic film structure, FIG. 4B is a perspective view of a ferrite magnetic film structure, and FIG. 5 is a perspective view illustrating a substrate of ferrite magnetic film structure according to another example of this invention.

This ferrite magnetic film structure exhibiting a magnetic anisotropy is composed of a substrate 2 and a ferrite magnetic film 1 formed on the surface (a main surface) of the substrate 2 (FIG. 4B). In the embodiment shown in FIG. 4A, a right-angled spiral-like groove is continuously formed on the surface of the substrate 2, wherein the width of the projected portion 21 formed between the right-angled spiral-like grooves is denoted as "a", the width of the recessed portion 22 constituting the spiral-like groove is denoted as "b", and the height of step (the depth of groove) between the projected portion 21 and the recessed portion 22 is represented by "h".

As shown in FIG. 4B, the ferrite magnetic film 1 having a saturated magnetic flux density Bs and a magnetic permeability μ is formed on the main surface of the substrate 2 by means of a printing method for instance. The thickness at the recessed portion 22 of the magnetic film 1 is set to "t". The magnetic film 1 is formed continuously on the substrate 2 and the upper surface of the magnetic film 1 is substantially flat. Since the groove is made continuous in a right-angled spiral form, the length in the longitudinal direction of the groove is much larger than the cycle of groove (a+b), and the length of substrate constituting an underlayer of the magnetic film is unlimited. If the conditions mentioned in relative to the first embodiment are met in this case, the magnetic film would be provided with a sufficient anisotropy.

$$(a/(a+b))(h/(t-h)) \geq 0.047 \quad (1)$$

A magnetic device such as an inductor can be fabricated by combining the aforementioned ferrite magnetic film having an anisotropy with a coil. In this case, if the coil is shaped into the same configuration as the spiral-like groove formed on the main surface of substrate, the ferrite magnetic film can be caused to always have a hard axis of magnetization in the perpendicular direction in relative to a magnetic field to be generated at the occasion of passing an electric current to the coil, and hence the ferromagnetic resonance frequency can be effectively increased toward a higher frequency side.

The groove to be formed on the main surface of substrate is not limited to the right-angled spiral-like groove as shown in FIG. 4A, i.e. almost the same effect as mentioned above can be obtained even when the groove is a concentric square groove as shown in FIG. 5. Namely, in the embodiment shown in FIG. 5, a concentric square groove is formed on the upper surface of the substrate 2. In FIG. 5, the width of the projected portion 21 formed between grooves is defined as "a", the width of the recessed portion 22 constituting the square groove is defined as "b", and the height of step (the depth of groove) between the recessed portion 22 and the projected portion 21 is defined as "h". A ferrite magnetic film structure exhibiting anisotropy can be obtained by forming a ferrite magnetic film on the main surface of the substrate 2 by means of a printing method.

As explained above, the ferrite magnetic film structure exhibiting magnetic anisotropy according to the second embodiment of this invention is featured in that it comprises a substrate provided on the surface thereof with a right-angled spiral-like recessed and projected portion (groove) or with a concentric square recessed and projected portion (grooves); and a ferrite magnetic film which is continuously formed on the aforementioned recessed and projected surface of substrate and has a substantially flat upper surface; and in that said ferrite magnetic film structure meets the following formula (1):

$$(a/(a+b))(h/(t-h)) \geq 0.047 \quad (1)$$

where "a" is a width of the projected portion; b is a width of the recessed portion; h is a height of step between the recessed portion and the projected portion (depth of groove); and t is a thickness of the ferrite magnetic film at the recessed portion.

If a ferrite magnetic film structure meets the aforementioned formula (1), it is possible to provide the ferrite magnetic film with a sufficiently large magnetic anisotropy, so that the ferrite magnetic film structure according to this second embodiment can exhibit a stable magnetic property without giving rise to the generation of resonance at a high frequency region of MHz or more.

Although the magnetic film structure according to the second embodiment of this invention is explained on a substrate provided on the surface thereof with a right-angled spiral or concentric square recessed and projected portion (grooves), this invention is not limited to these configurations, but the shape of the groove may be simply a spiral or concentric circular configuration.

Figure 6:
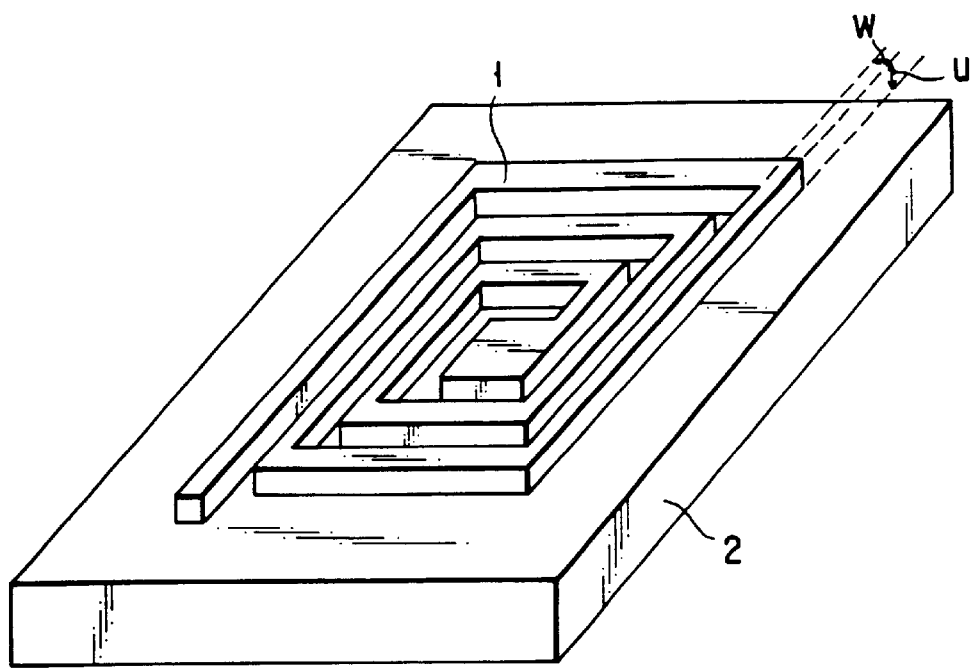
FIGS. 6 and 7 are perspective views of ferrite magnetic film structure according to a third embodiment of this invention.
Figure 7:
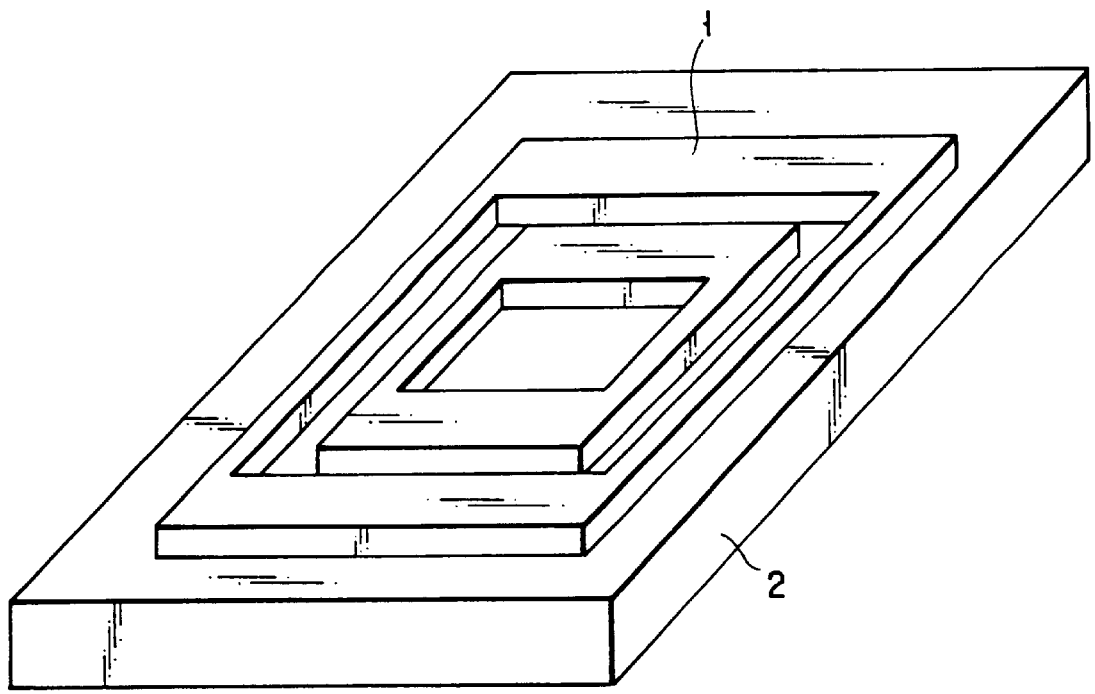

Next, the magnetic film structure according to a third embodiment of this invention will be explained with reference to FIGS. 6 and 7, wherein FIGS. 6 and 7 are perspective views of ferrite magnetic film structure according to a third embodiment of this invention. This ferrite magnetic film structure exhibiting magnetic anisotropy is composed of a substrate 2, a ferrite magnetic film 1 formed on the surface (main surface) of the substrate 2. This ferrite magnetic film structure can be obtained by forming a ferrite magnetic film 1 having a saturated magnetization Is and a magnetic permeability g on the surface (main surface) of the substrate 2 by means of a printing method.

In this case, if the width of the magnetic film 1 is represented by w, and the thickness of the magnetic film 1 is represented by u, the magnetic film 1 may be considered as a magnetic body which is approximately infinite in length, w in width and u in thickness, and is enabled to generate a diamagnetic field in traverse direction. On the other hand, in the direction perpendicular to the traverse direction, the diamagnetic field may be disregarded. Therefore, by forming the shape of magnetic material into a continuous spiral-like configuration, it is possible to a magnetic film exhibiting an anisotropy where the traverse direction thereof is constituted by hard direction of magnetization. Further, in the magnetic film structure according to this embodiment, since the groove formed in the spiral-like magnetic film is continuous, the substrate constituting an underlying layer of magnetic film would not be restricted in length.

The anisotropic magnetic field Hdv in the direction perpendicular to the groove, which is to be generated in plane of magnetic film, is proportional to u and inversely proportional to w. On the other hand, the anisotropic magnetic field in the direction parallel to the groove is proportional to w and inversely proportional to u.

Accordingly, Hdv can be expressed as follows.

$$Hdv \cong Is/\mu_0 \cdot (u^2/(w^2+u^2))$$

By the way, in order to render a ferrite material to be useful in the MHz band, the ferromagnetic resonance frequency of the ferrite material is required to set to 10 MHz or more (2 to 10 times as large as the frequency to be used). Therefore, the anisotropic magnetic field Ha is required to meet the condition of: $Ha \geq 3 \times 10^2$ [A/m].

Namely, it is required to meet the condition of: $Is/\mu_0 \cdot (u^2/(w^2+u^2)) \geq 3 \times 10^2$ [A/m]. Therefore, if the condition of: $u^2/(w^2+u^2) \geq 1.2 \times 10^{-3}$ is met in ferrite materials of various kinds, it is possible to render the ferrite materials to be useful stably at MHz band.

The magnetic film formed on the main surface of substrate may be concentric square as shown in FIG. 7 in obtaining almost the same effects as mentioned above. Namely, in FIG. 7, a concentric square ferrite magnetic film 1 is formed on the surface of the substrate 2 by means of a printing method.

As explained above, the ferrite magnetic film structure exhibiting a magnetic anisotropy is featured in that a ferrite magnetic film having a right-angled spiral-like pattern or a concentric square pattern is formed on the surface of substrate, and in that the ferrite magnetic film structure meets the following formula:

$$u^2/(w^2+u^2) \geq 0.12 \times 10^{-3}$$

where w is the width of the ferrite magnetic film; and u is the thickness of the ferrite magnetic film.

If a ferrite magnetic film structure meets the aforementioned formula (1), it is possible to provide the ferrite magnetic film 1 with a sufficiently large magnetic anisotropy, so that the ferrite magnetic film structure according to this third embodiment can exhibit a stable magnetic property without giving rise to the generation of resonance at a high frequency region of MHz or more.

Although the magnetic film structure according to the third embodiment of this invention is explained on a right-angled spiral-like or concentric square magnetic film, this invention is not limited to these configurations, e.g. the magnetic film may be simply of a spiral or concentric circular configuration.

Next, a planar magnetic device according to a fourth embodiment of this invention will be explained with reference to FIGS. 8 and 9.

Figure 8:
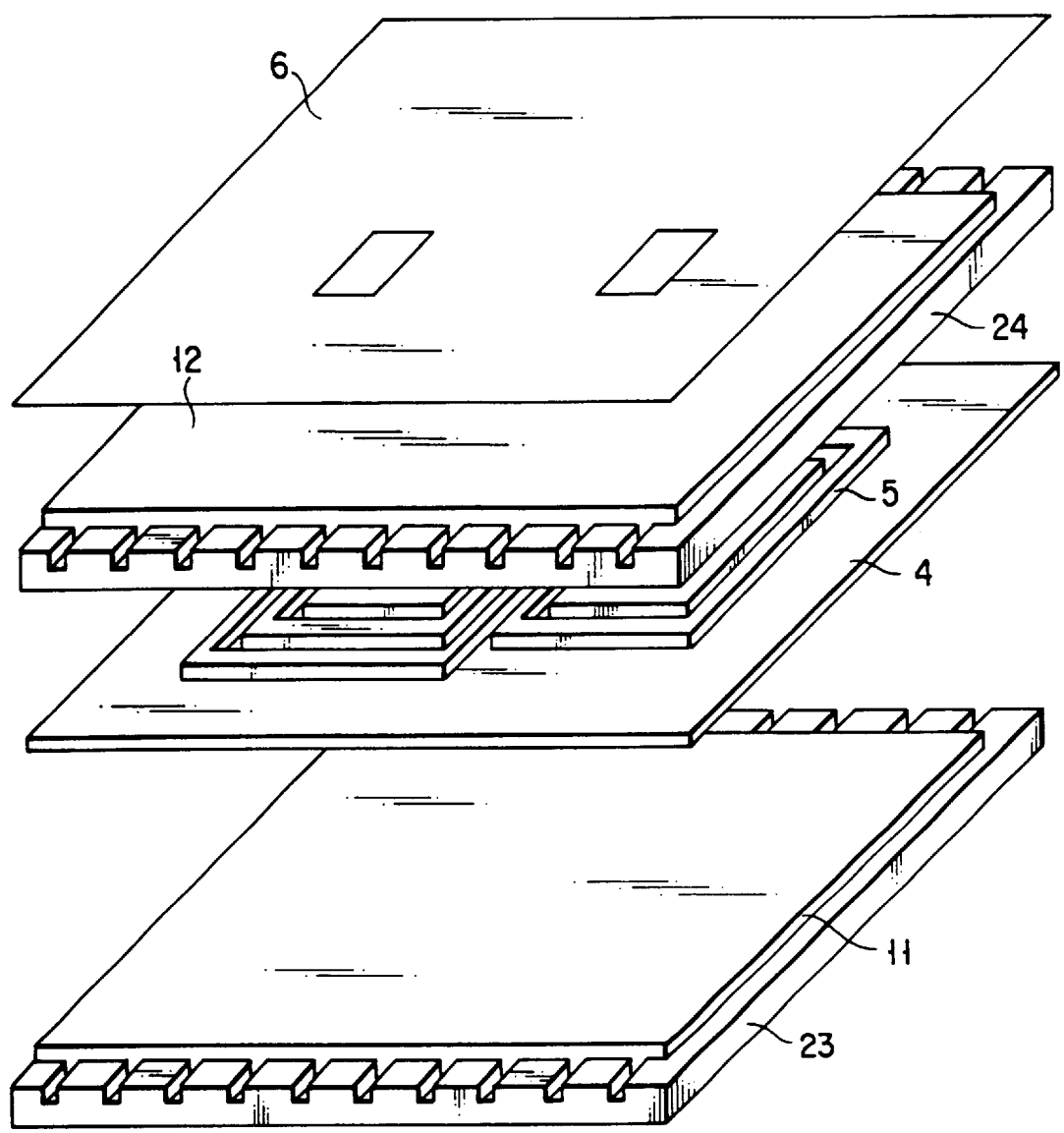
FIG. 8 is an exploded perspective view illustrating the assembling of a planar magnetic device utilizing a ferrite magnetic film structure exhibiting a magnetic anisotropy and shown in FIGS. 2 and 3A.
Figure 9:
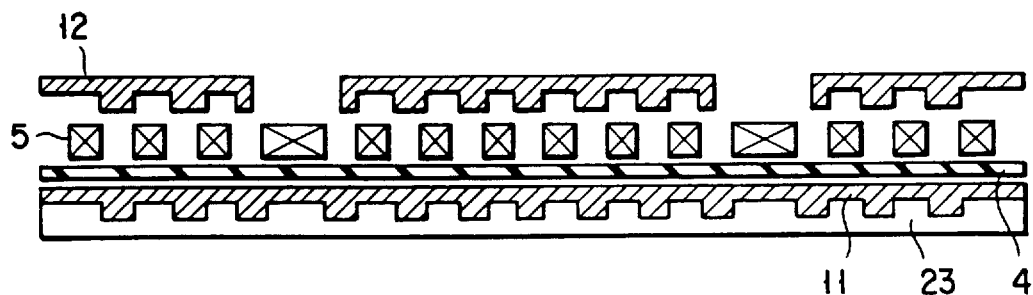
FIG. 9 is a cross-sectional view of a planar magnetic device shown in FIG. 8.

FIG. 8 is an exploded perspective view illustrating the assembling of a planar magnetic device utilizing a ferrite magnetic film structure exhibiting a magnetic anisotropy and shown in FIGS. 2 and 3A and FIG. 9 is a cross-sectional view of the planar magnetic device shown in FIG. 8.

Referring to FIGS. 8 and 9, a first ferrite magnetic film 11 is formed on the main surface of a lower substrate 23 provided on its surface with recessed and projected portions. The substrate 23 is formed of a silicon wafer, a glass substrate, a ceramic substrate, etc., and mechanically worked by means of blade cutting work so as to form a recessed and projected surface. Alternatively, the recessed and projected main surface of substrate may be formed by a process wherein a patterned mask is formed on the main surface of substrate and then the substrate is anisotropically etched by making use of this patterned mask. Alternatively, a nitride film consisting of AlN, SiN, etc. is formed on the underlying substrate, after which a patterned mask is formed on the nitride film and then the substrate is anisotropically etched by making use of this patterned mask.

As for at least surface portion of the substrate, it is possible to employ a metal such as zirconium, copper, aluminum, etc. However, since metallic material may diffuse into the magnetic film, if a metal is to be employed as a substrate, the surface of the substrate should preferably be covered with a diffusion-preventive film such as $SiO_2$.

An insulating film 4 is formed on the first ferrite magnetic film 11 provided with a magnetic anisotropy, and a coil 5 is formed on the insulating film 4 through a patterning process. An upper substrate 24 is disposed over this coil 5. Specifically, the back surface of the upper is made flat and contacted with the coil 5. However, the upper surface of the upper substrate 24 is formed into a recessed and projected surface, on which a second ferrite magnetic film 12 having a flat upper surface and magnetic anisotropy is formed.

The second ferrite magnetic film 12 having magnetic anisotropy is protected by a passivation film 6. This passivation film 6 is mainly formed of an organic insulating film comprising a resin such as polyimide, fluororesin, etc., but may be formed of an inorganic insulating film such as $SiO_2$, SiN, AlN, etc.

By subjecting a magnetic film to a recessed and projected portion-forming working so as to form a groove on the surface of the film, the magnetic film can be provided with magnetic anisotropy originating from the shape anisotropy. The magnetic anisotropy can be controlled by adjusting the depth (h) of the groove, the width (a) of the projected portion between the grooves, the width (b) of the recessed portion constituting the groove and the thickness (t) of the magnetic film at the recessed portion (FIGS. 3A to 3C). The groove is formed in parallel with the direction perpendicular to the direction which is most prevailing in terms of area among the directions of magnetic fields to be generated as a DC electric current is passed to the coil 5. The insulating film 4 and the insulated upper substrate 24 are interposed between the ferrite magnetic film/the coil, thus completely insulating the magnetic films 11 and 12 from the coil 5.

As explained above, the planar magnetic device according to the fourth embodiment of this invention is featured in that the coil is sandwiched via an insulating film between the first and second ferrite magnetic film structures each being formed of a ferrite magnetic film structure having magnetic anisotropy as shown in FIG. 3A. It is now possible with this construction to obtain a planar magnetic device to be used at a high frequency region of MHz or more by making use of a ferrite material which has been conventionally deemed difficult to provide with magnetic anisotropy. By the way, any one of magnetic films may be formed by making use of a conventional vapor phase deposition method.

Next, a planar magnetic device according to a fifth embodiment of this invention will be explained with reference to FIGS. 10 and 11.

Figure 10:
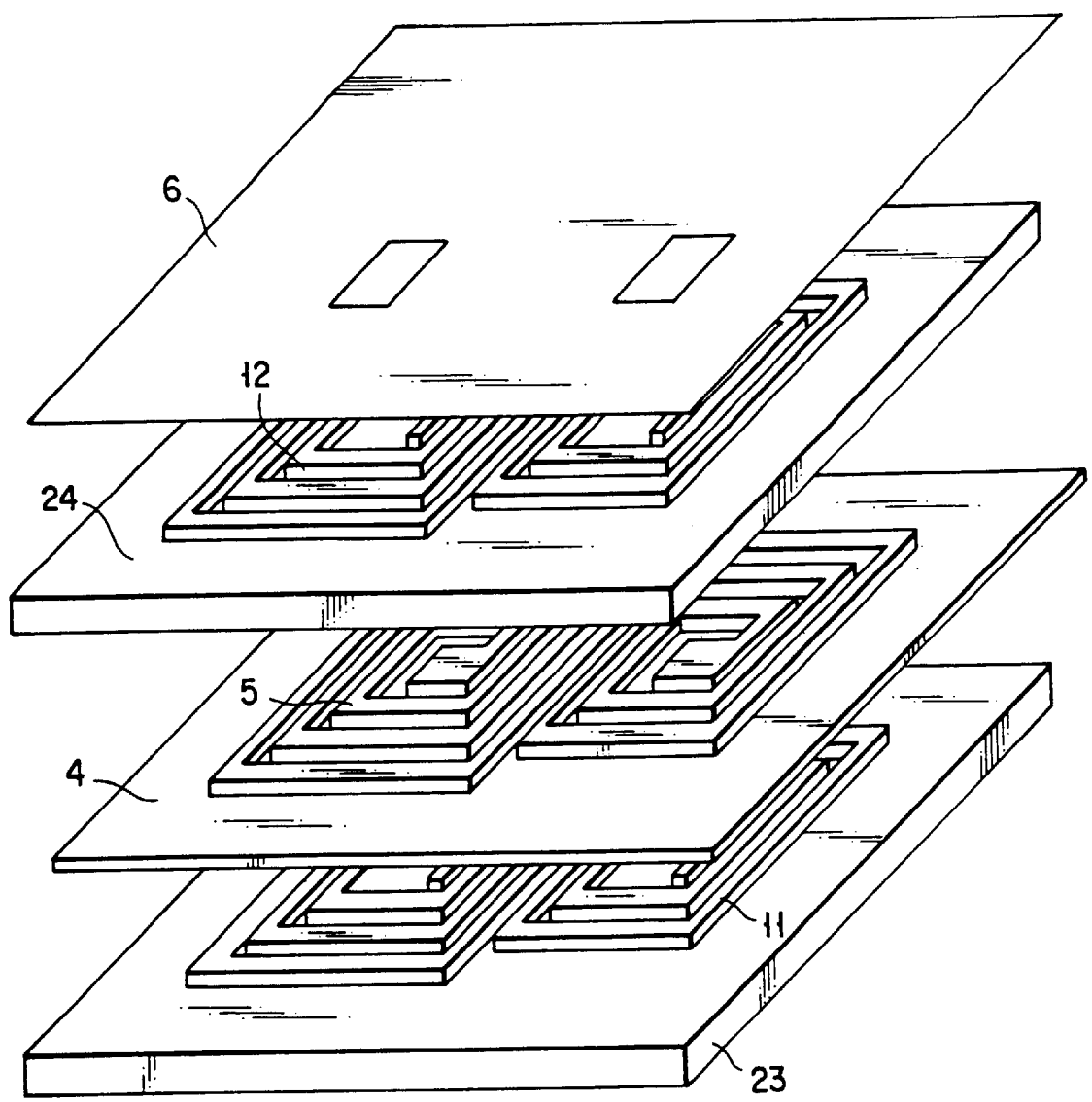
FIG. 10 is an exploded perspective view illustrating the assembling of a planar magnetic device utilizing a ferrite magnetic film exhibiting a magnetic anisotropy and shown in FIG. 6.
Figure 11:
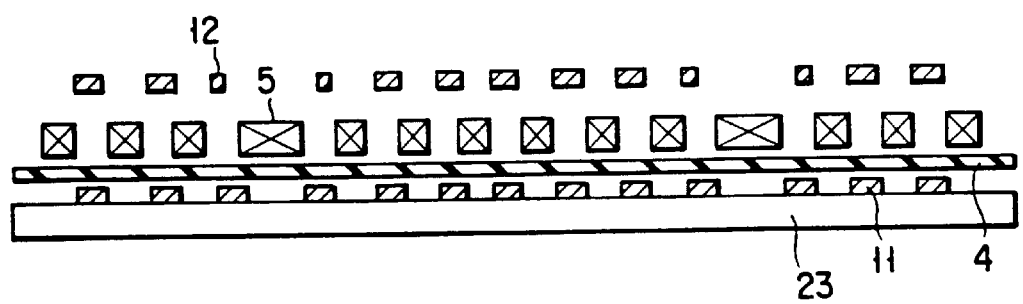
FIG. 11 is a cross-sectional view of a planar magnetic device shown in FIG. 10.

FIG. 10 is an exploded perspective view illustrating the assembling of a planar magnetic device utilizing a ferrite magnetic film structure exhibiting a magnetic anisotropy and shown in FIG. 6 and FIG. 11 is a cross-sectional view of the planar magnetic device shown in FIG. 10.

Referring to FIGS. 10 and 11, a first ferrite magnetic film 11 having right-angled spiral-like magnetic anisotropy is formed on the main surface of a lower substrate 23. The substrate 23 may be formed of a silicon wafer, a glass substrate, a ceramic substrate, etc. Alternatively, the substrate may be covered on its surface with a nitride film consisting of AlN, SiN, etc.

An insulating film 4 is formed on the first ferrite magnetic film 11 provided with a magnetic anisotropy, and a coil 5 is formed on the insulating film 4 through a patterning process. An upper substrate 24 is disposed over this coil 5. Specifically, the back surface of the upper is made flat and contacted with the coil 5. A second ferrite magnetic film 12 having right-angled spiral-like magnetic anisotropy is formed on the upper surface of the upper substrate 24. This second ferrite magnetic film 12 having magnetic anisotropy is protected by a passivation film 6.

The shaping of these magnetic films 11 and 12 into a right-angled spiral-like configuration can be achieved by any suitable printing method enabling a formation of pattern such as a screen printing method wherein a paste of a ferrite material is employed. Alternatively, the formation of these right-angled spiral-like magnetic films 11 and 12 can be achieved by making use of a wet method such as a plating method. The magnetic anisotropy can be controlled by adjusting the height (u) and width (w) of the right-angled spiral-like magnetic film. In this case, the extending direction of the right-angled spiral-like magnetic film in each location should always become perpendicular to the direction of magnetic field to be generated as an electric current is passed to the coil 5.

As explained above, the planar magnetic device according to the fifth embodiment of this invention is featured in that the coil is sandwiched via an insulating film between the first and second ferrite magnetic films each being formed of a ferrite magnetic body having magnetic anisotropy as shown in FIG. 6. It is now possible with this construction to obtain a planar magnetic device to be used at a high frequency region of MHz or more by making use of a ferrite material which has been conventionally deemed difficult to provide with magnetic anisotropy. Further, it is possible to render the magnetic film to be provided with uniaxial magnetic anisotropy in an in-plane direction of the substrate so as to allow an extending direction of the planar coil conductor to be maintained parallel with easy direction of magnetization, and to render the entire surface of the magnetic film to exhibit hard magnetization against a coil current.

Next, a planar magnetic device according to a sixth embodiment of this invention will be explained with reference to FIGS. 12A to 14B. FIGS. 12A to 14B are perspective views illustrating a manufacturing process of a planar magnetic device according to a sixth embodiment of this invention.

Figure 12A:
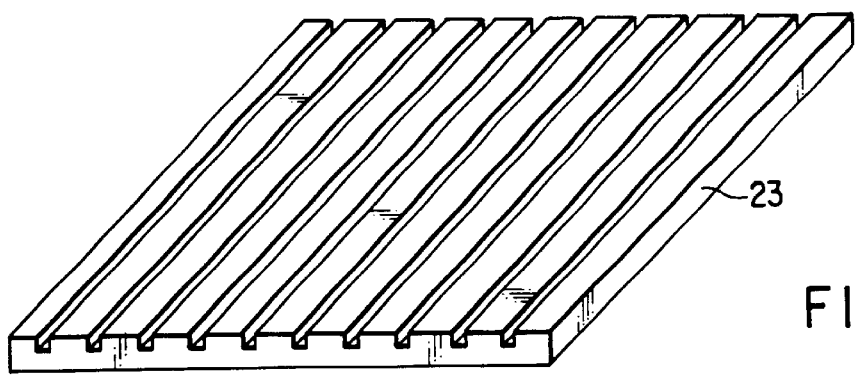
FIGS. 12A and 12B are perspective views illustrating a manufacturing process of a planar magnetic device according to a sixth embodiment of this invention.

The ferrite magnetic film having magnetic anisotropy is consisted of a lower magnetic film structure and an upper magnetic film structure. First of all, as shown in FIG. 12A, grooves are formed on the surface of the lower substrate 23 by means of a printing method. For example, these grooves can be formed by screen-printing a dispersed solution comprising $SiO_2$ fine particles dispersed in a solvent on the surface of the substrate. Alternatively, the recessed and projected portion (grooves) may be directly formed on the surface of the substrate by means of mechanical work such as blade work or by means of working method using a laser beam.

Figure 12B:
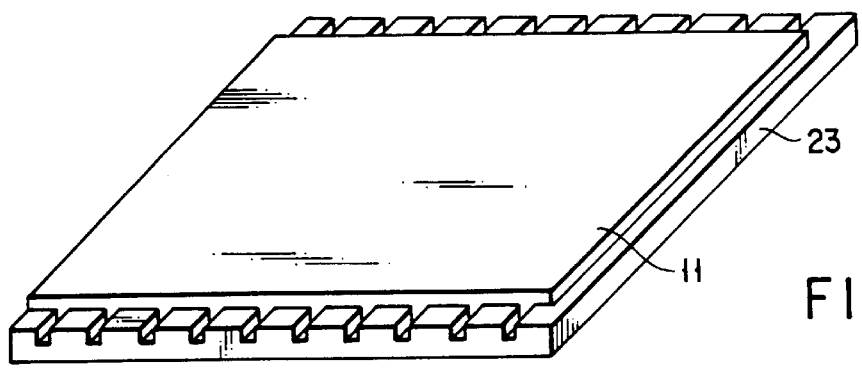

Then, as shown in FIG. 12B, magnetic films 11 and 12 are formed on the surface of the lower substrate 23. At the occasion of forming these magnetic films 11 and 12, a ferrite solution comprising a ferrite powder dispersed in a binder is employed. As for the mask to be employed in the printing, one having a configuration which enables a planar magnetic device (inductor) to be formed on a wafer in an isolated state through dicing lines may be employed.

After the ferrite solution is coated on the wafer, the coated layer is annealed at a temperature of not lower than the curing temperature of the binder or than the sintering temperature of magnetic powder, thereby solidifying the coated layer. In this embodiment, an Ni—Zn-based ferrite was employed and sintered at a temperature of 300° C. Thereafter, the insulating film 4 is formed and then a plating underlying film Cu is formed. Subsequently, a resist frame is formed in the shape of space of coil.

Figure 13A:
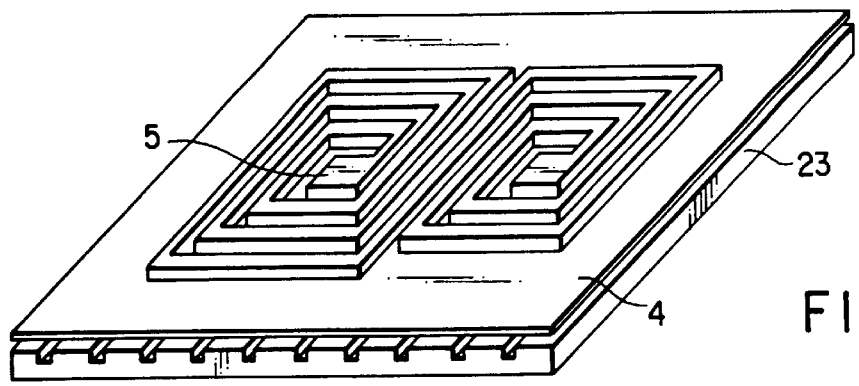
FIGS. 13A and 13B are perspective views illustrating a manufacturing process of a planar magnetic device according to a sixth embodiment of this invention.

After the magnetic film 11 is formed, an insulating film 4 formed on the magnetic film 11 as shown in FIG. 13A with a view to improve the flatness and insulating property of the magnetic device. This insulating film 4 can be formed using an organic film such as a polyimide film or an inorganic film to be prepared using a glass paste comprising glass dispersed therein. The thickness of the insulating film 4 may be in the range of 1 to 20 µm.

When the specific resistance of the magnetic film 11 is large, the insulating film 4 may not be formed. The plating underlying film may be formed of a 2-ply structure comprising an adhesive film for reinforcing the adhesivity of the plating underlying film, examples of the 2-ply structure being Nb/Cu and V/Cu. A contact hole for forming a pad may be preliminarily formed in the insulating film 4. After a plating frame (resist frame) is formed, a coil 5 is formed on the insulating film 4 by means of electrolytic plating method. After the plating frame is removed, the plating underlying film for the coil is removed. The coil 5 may be formed by means of printing method employing a conductive paste. The conductive film such as Cu which is formed all over the surface may be worked by means of etching.

Figure 13B:
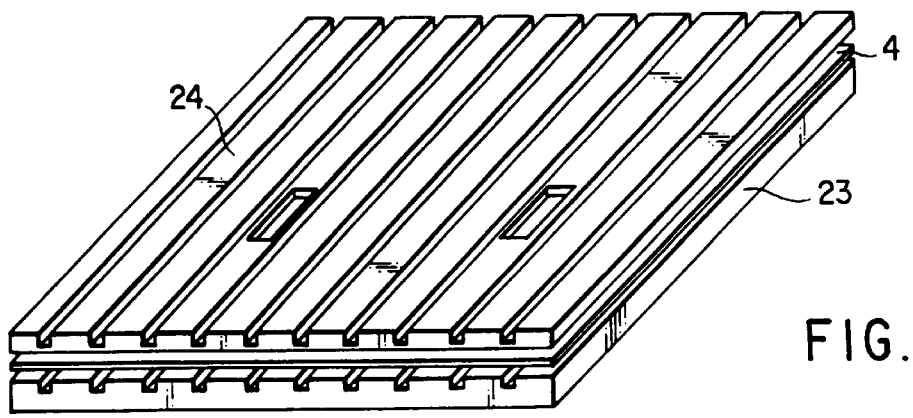

Subsequently, an insulating film 24 to be employed as a substrate of the upper magnetic film is formed over the coil 5 as shown in FIG. 13B. Thereafter, not only grooves constituting the recessed and projected portions but also the contact hole for forming a pad are formed on the surface of the insulating film 24.

Figure 14A:
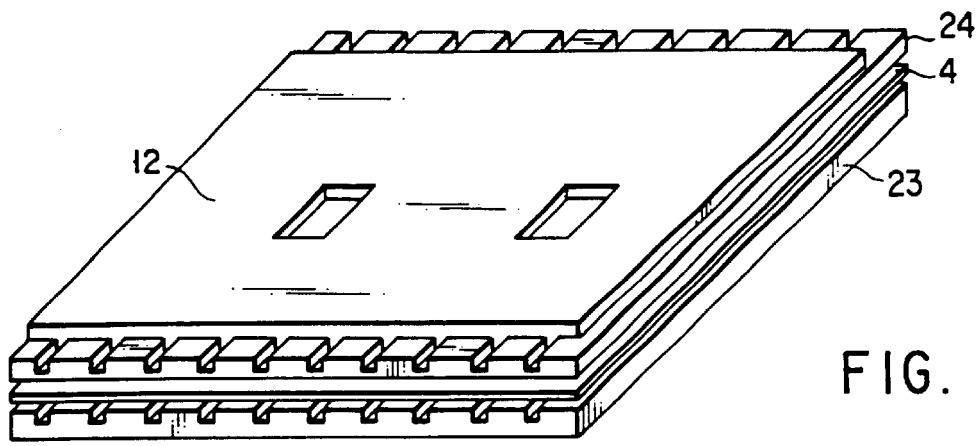
FIGS. 14A and 14B are perspective views illustrating a manufacturing process of a planar magnetic device according to a sixth embodiment of this invention.

Then, the aforementioned ferrite solution is coated again, and the coated layer is sintered and solidified at a temperature of not lower than the curing temperature of the binder, thereby forming a magnetic film 12 consisting of ferrite as shown in FIG. 14A. In this case, the mask to be employed at the occasion of printing is formed in such a manner that the inductor to be formed on the wafer is isolated through dicing lines, and a contact hole for forming a pad is formed in the magnetic film 12.

Figure 14B:
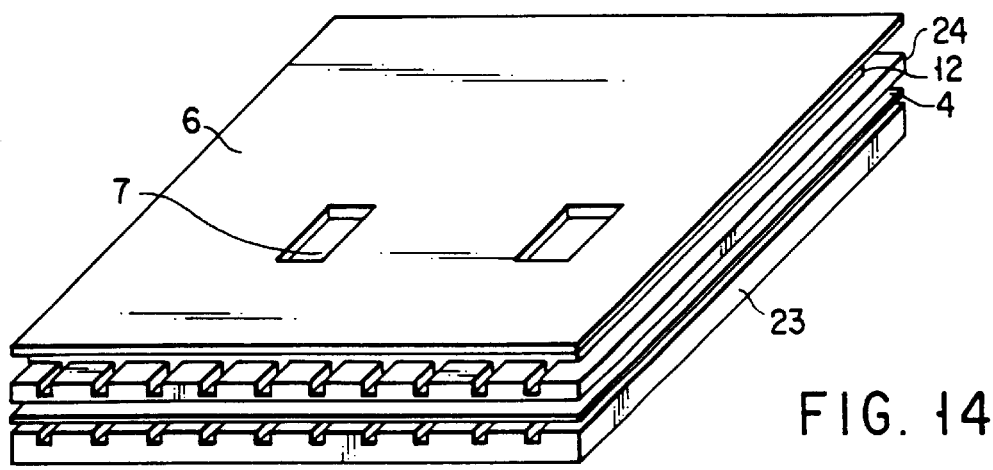

Then, as shown in FIG. 14B, a pad electrode (lead-out electrode) 7 to be electrically connected with the coil 5 through the contact hole is formed. This pad electrode 7 is formed in such a manner that it provides an optimum metallic surface depending on the manner of contacting with an external component. For example, when a wire bonding is to be adopted, the outermost layer of the pad electrode 7 should be constituted by Al or Au. The underlying layer of the outermost layer may be constituted by a metal such as V or Mo. Further, with a view to improve the reliability of magnetic device, the magnetic film 12 may be entirely covered by a passivation film 6 except the portions where the pad electrode is formed.

The upper magnetic film may be constituted by a magnetic metal or a magnetic amorphous material instead of a ferrite film. In this case., the coil should be covered with the aforementioned insulating film in order to ensure the insulation between the coil and the upper magnetic film. The upper magnetic film may be formed after the space portion of coil is buried with polyimide so as to flatten the surface of device.

As compared with a thin film inductor wherein the magnetic film thereof is prepared by means of the conventional sputtering method, the thin film inductor prepared according to the aforementioned method has been found possible to greatly raise the electric current that would initiate the saturation of the magnetic body.

The specification and characteristics of the inductor prepared according to the aforementioned method are as follows. First of all, the magnetic film is constructed such that the material thereof is Ni—Zn-based ferrite; the film thickness is 50 $\mu$m; "a" shown in FIGS. 2 and 3A is 50 $\mu$m; "b" is 25 $\mu$m; "h" is 20 $\mu$m; and "t" is 50 $\mu$m. The coil is constructed such that the material thereof is Cu; and the film thickness is 40 $\mu$m. The dimension of the inductor is 6.45×4.85 mm. The structure of the coil is a double spiral coil and the L/S thereof is 25/50 $\mu$m. The number of turns of the coil is 20 turns. The inductance at 5 MHz is 2.5 $\mu$H. The electric current (I sat) that would initiate the saturation of the magnetic body is 4 A. The DC resistance thereof is 3.2 $\Omega$.

On the other hand, as for an inductor using a flat Ni—Zn ferrite, the inductance at 5 MHz is 2.1 $\mu$m, the current (I sat), in which a magnetic body begins saturation, is 3.2A, and the resistance is 3.2 $\Omega$.

By contrast, the specification and characteristics of the inductor employing an amorphous magnetic film prepared by means of a vapor deposition method are as follows. First of all, the magnetic film is constructed such that the material thereof is FeCoBC; the film thickness is 6 $\mu$m. The coil is constructed such that the material thereof is Cu; and the film thickness is 40 $\mu$m. The dimension of the inductor is 6.45×4.85 mm. The structure of the coil is a double spiral coil and the L/S thereof is 25/50 $\mu$m. The number of turns of the coil is 20 turns. The inductance is 3 pH. The electric current (I sat) that would initiate the saturation of the magnetic body is 0.8 A. The DC resistance thereof is 3.2$\Omega$.

Figure 15:
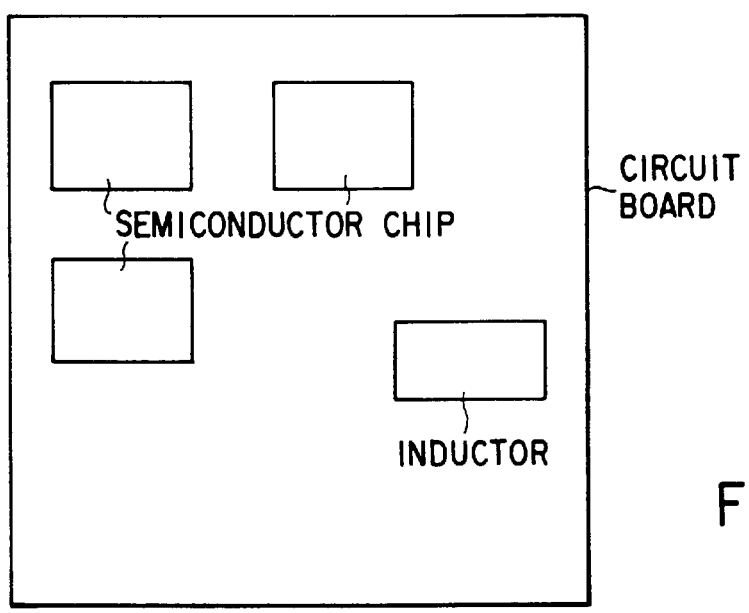
FIG. 15 is a plan view of a circuit substrate on which a semiconductor chip is mounted.

FIG. 15 is a plan view of a circuit substrate on which semiconductor chips are mounted. As shown in FIG. 15, an inductor employing the magnetic film structure according to this invention is mounted on the circuit substrate together with the semiconductor chips such as a logic and a memory. Although the dimension of the inductor is almost the same as that of the conventional inductor, the inductor according to this invention can be reduced in thickness so that the inductor can be arranged and mounted in the same manner as a semiconductor chip. As a result, the inductor is no more required to be attached to the outside of the circuit substrate as in the case of conventional device, thus making it possible to miniaturize the device.

It is possible according to the first to sixth embodiments to provide a ferrite magnetic film with a sufficiently large magnetic anisotropy even if it is formed by means of a thick film-forming method such as a printing method. As a result, it is possible to enable the ferrite magnetic film to exhibit a stable magnetic property without giving rise to resonance in a high frequency zone of MHz or more. Further, the ferrite magnetic film can be formed into a right-angled spiral configuration or a right-angled concentric configuration, thereby making it possible to specify the magnetic anisotropy in plane of the film in the circumferential direction of right-angled spiral or right-angled ring structure and to provide the ferrite magnetic film with a large magnetic anisotropy.

Further, since a ferrite magnetic film provided with a shape anisotropy is formed by means of a thick film-forming method such as a printing method, it is possible to obtain a planar magnetic device to be used at a high frequency region of MHz or more by making use of a ferrite material which has been conventionally deemed difficult to provide with magnetic anisotropy. Furthermore, since a thick film can be employed, it is possible to inhibit a magnetic saturation that may be generated at the occasion of passing an electric current to the coil, thus ensuring a stable device characteristic even when a relatively large coil current is employed.

Next, a magnetic device according to a seventh embodiment of this invention will be explained.

When it is desired, in a magnetic device employing a lead-out wiring for the connection with an external circuit, to reduce a direct current resistance at the pad portion of coil, it is generally required to increase the number of bonding wire or to thicken the lead-out wiring. However, when the number of bonding wire is increased or the lead-out wiring is thickened, it will lead to a problem that the eddy current loss would be increased at the pad portion of the coil. This problem can be ascribed to the fact that since an opening is formed in the upper magnetic film, the pad is formed simultaneous with the formation of the coil, and hence the thickness of the pad becomes the same as that of the coil. This problem can be also ascribed to the fact that the wire employed therein is made relatively thick for the purpose of reducing the direct current resistance. The seventh embodiment of this invention overcomes such a problem.

Figure 16:
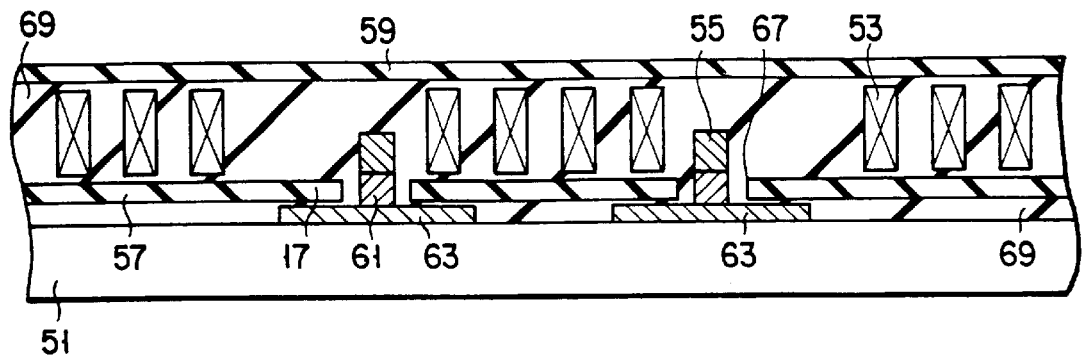
FIG. 16 is a cross-sectional view illustrating a planar inductor according to a seventh embodiment of this invention.
Figure 17:
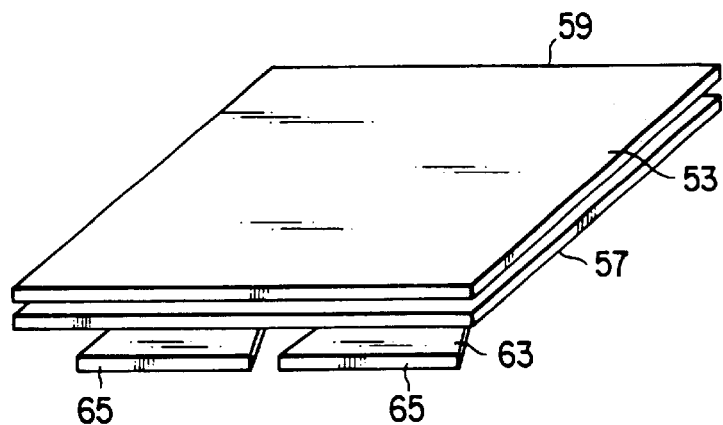
FIG. 17 is a perspective view of the planar inductor shown in FIG. 16.

FIG. 16 shows a cross-sectional view illustrating a magnetic device according to the seventh embodiment of this invention; FIG. 17 shows a perspective view of the magnetic device shown in FIG. 16; and FIG. 18 shows an enlarged cross-sectional view illustrating a region near the pad.

First of all, as shown in FIG. 16, a planar coil 53 is formed on a substrate 51 in such a manner that it is interposed between an upper magnetic film 59 and a lower magnetic film 57. The substrate 51 may be formed of a glass resin or a semiconductor substrate.

A via hole 67 for a pad is formed in the lower magnetic film 57, and a pad 55 is formed inside the via hole 67. The pad 55 is connected via a lead-out wiring 63 and a terminal 65 with an external circuit device. Further, in order to ensure insulation among the coil 53, the upper magnetic film 59, the lower magnetic film 57 and the lead-out wiring 63, an interlayer insulating film 69 is interposed between these layers.

Figure 18:
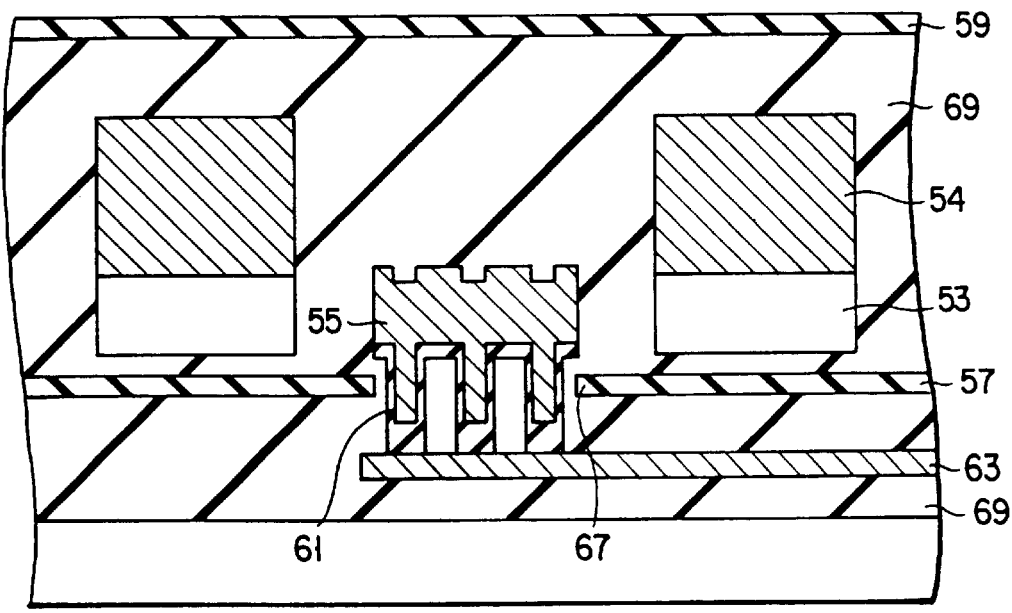
FIG. 18 is an enlarged cross-sectional view illustrating a region near the pad of the planar inductor shown in FIG. 16.

As shown in FIG. 18, a plated layer 54 is formed on the upper layer of the coil 53. Further, a lead-out electrode 61 which is partitioned into plural parts is disposed at the lower portion of the pad 55, and is connected with an external circuit device via the lead-out wiring 63.

Figure 19:
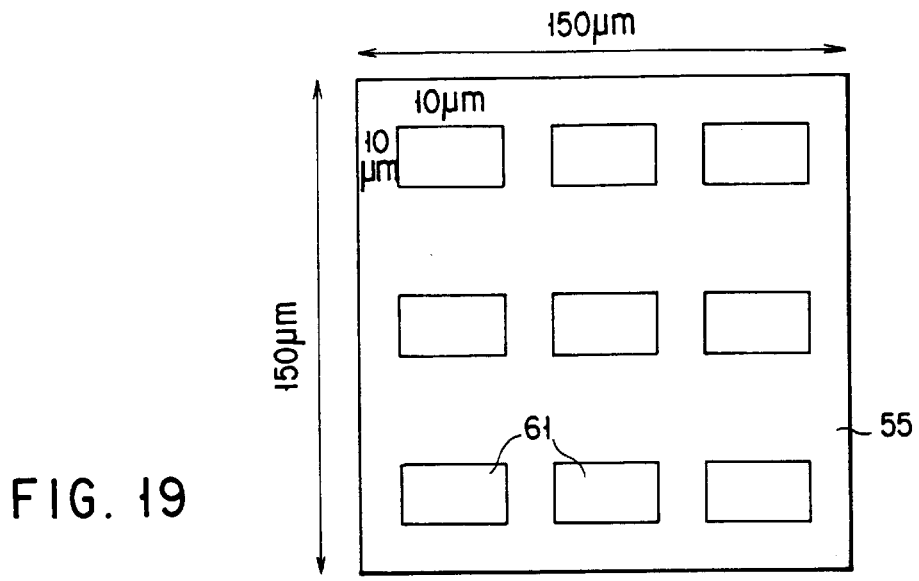
FIG. 19 is a plan view illustrating a region near the pad of the planar inductor shown in FIG. 16.

FIG. 19 shows the pad 55 as it is viewed from the lead-out electrode 61. The pad 55 is square in shape and has a dimension of 150 $\mu$m×150 $\mu$m. The lead-out electrode which is partitioned into 9 sections each section having a square cross-section having a dimension of 10 $\mu$m×10 $\mu$m is formed inside the region of the pad 55. By partitioning the lead-out electrode 61 into plural sections as mentioned above, it is possible to minimize the direct current resistance even when an electric current is passed to the pad 55.

When magnetic device is constructed according to this embodiment, the connection of coil can be achieved through the same degree of via hole as the ordinary coil, and electric current can be passed to the coil with the same degree of direct current resistance as that of the ordinary coil. The eddy current loss at this portion is about 0.001 mW when the component of magnetic flux in the direction normal to the magnetic film surface is set to Bgy: 200G; the dimension of the contacting region of via hole is set to 30×30×40 $\mu$m; and the frequency of the current to be passed to the circuit is set to 5 MHz. Therefore, the eddy current loss can be sufficiently minimized, thus making it possible to provide a magnetic device exhibiting a minimal eddy current loss.

Next, the process of manufacturing a magnetic device mounted with a planar inductor according to this invention will be explained in stepwise with reference to FIGS. 20 to 25.

Figure 20:
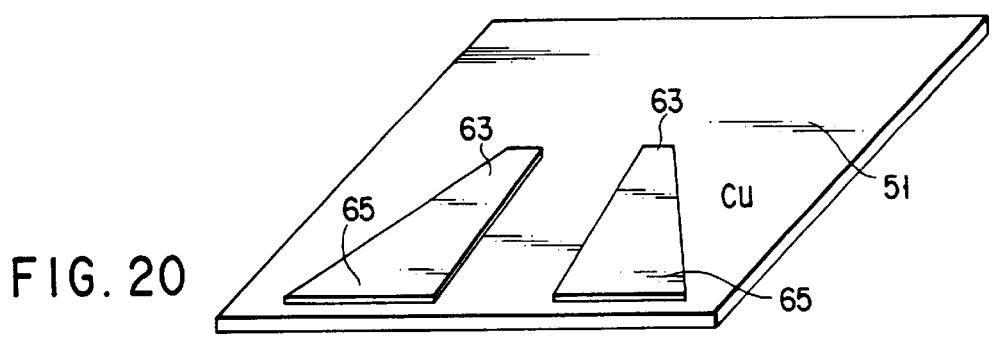
FIGS. 20 to 25 are cross-sectional views illustrating the manufacturing steps of the planar inductor shown in FIG. 16.

First of all, as shown in FIG. 20, the lead-out wiring 63 and the terminal 65 are simultaneously formed on the substrate 51 made of glass for instance. The material for these lead-out wiring 63 and terminal 65 may be an ordinary conductive body such as Cu, Al, Au, etc. The thickness of the conductive body should preferably be 2 to 3 $\mu$m or more in view of reducing the direct current resistance.

Figure 21:
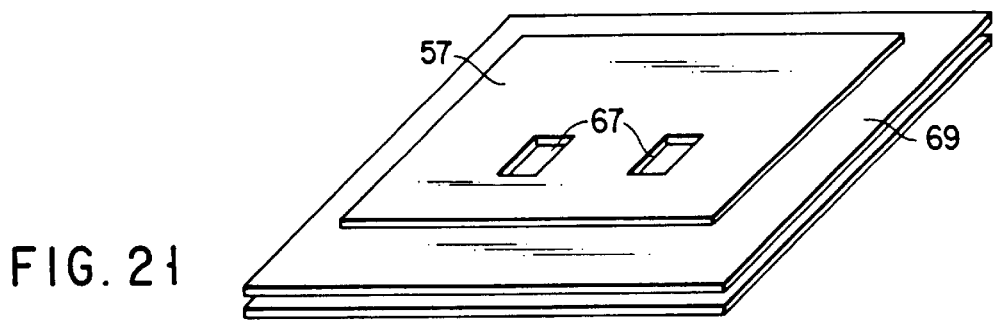

Then, as shown in FIG. 21, an interlayer insulating film 69 is formed for the purpose of inhibiting the electric contact among the lower magnetic film 57, the lead-out wiring 63 and the terminal 65. The thickness of this interlayer insulating film 69 may be as thin as 2 to 3 $\mu$m. Further, the lower magnetic film 57 is formed on this interlayer insulating film 69. A via hole 67 is formed at the central portion of the lower magnetic film 57 thereby allowing the terminal material to be contacted with a coil to be formed at a subsequent step. Since the depth of via hole is several micrometers, the size of the via hole 67 may be sufficient if it is larger than the size of the pad by about 10 $\mu$m.

Figure 22:
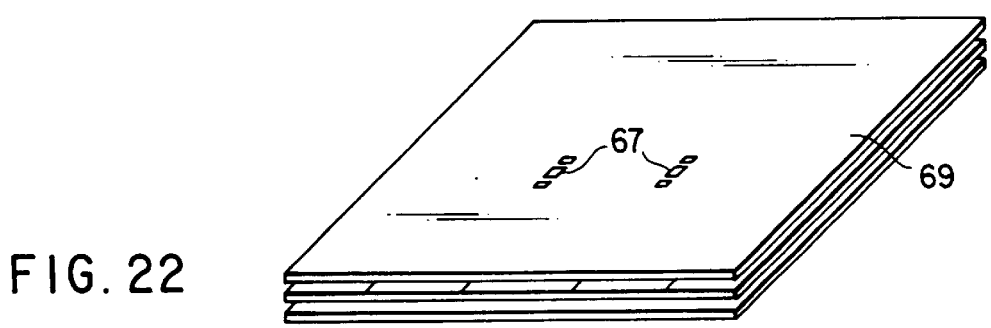

Then, as shown in FIG. 22, an interlayer insulating film 69 is formed on the lower magnetic film 57. The thickness of this interlayer insulating film 69 may be as thin as 3 to 5 $\mu$m. Further, a via hole 67 is formed also in the interlayer insulating film 69 in order to allow the terminal 65 to be contacted with the coil. In this case, the depth to be worked may be about 5 to 8 $\mu$m. If it is possible to realize an excellent PEP where the underlying layer is free from a recessed and projected portion and from warpage of wafer, a via hole having a size of 30 $\mu$m square can be easily formed. The number of via hole may be only one. However, it is more preferable, in view of minimizing the direct current resistance and the generation of eddy current, to form a plurality of small via holes so as to connecting them with the coil.

Figure 23:
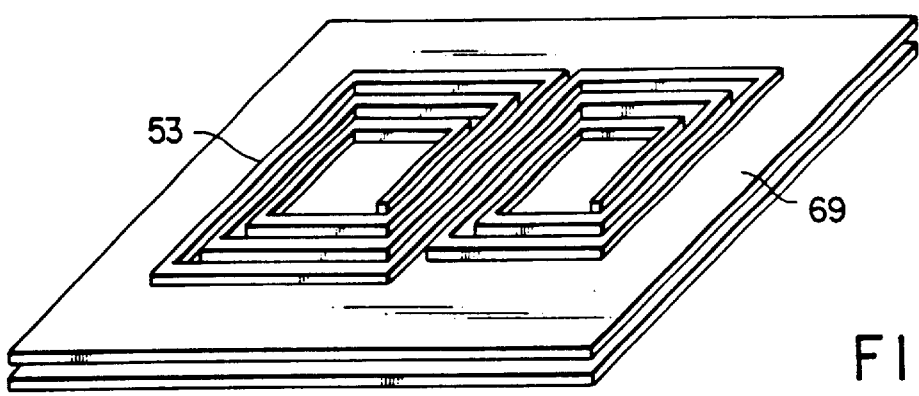

Subsequently, the coil 53 is formed on the interlayer insulating film 69 as shown in FIG. 23. The coil 53 may be formed into a 2-ply structure by making use of a sputtering of Cu and an electrolytic plating of Cu. In this case, if a portion of coil pattern is disposed over the via hole 67, this portion of coil would grow in the via hole at the occasion of plating, thus enabling the lead-out wiring 63 and the coil 53 to be electrically connected excellently with each other.

The thickness of the coil should preferably be 20 $\mu$m or more. According to the prior art, since the lead-out electrode is required to be formed at an upper portion, the thickness of the lead-out electrode is required to be set to about 50 to 100 $\mu$m. In addition to the above reason, since the lead-out electrode is formed on the upper magnetic film according to the prior art, the underlying layer is not flat, so that if a lead-out wiring which is stably low in electric resistance is to be formed, the lead-out electrode is required to be sufficiently thick.

Figure 24:
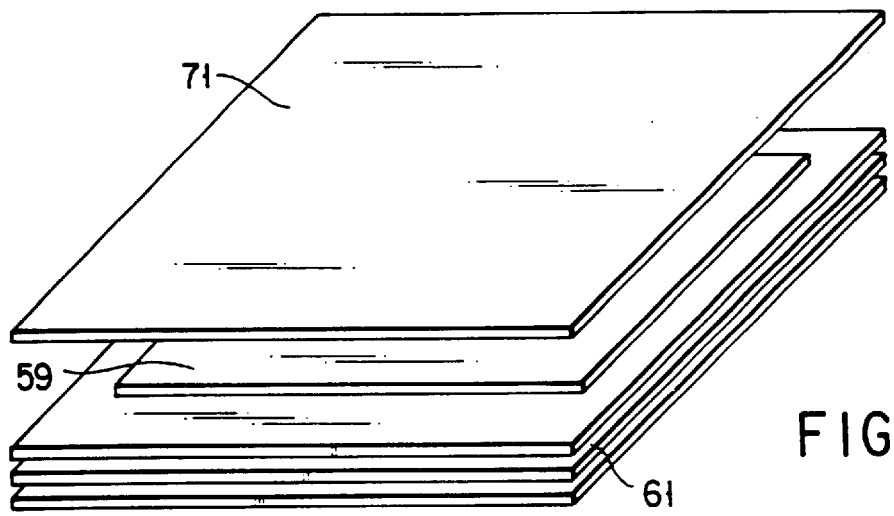

Then, as shown in FIG. 24, an upper magnetic film 59 is formed on the interlayer insulating film 69 as well as on the coil 53, and then a passivation film 71 is formed on the upper magnetic film 59 for the purpose of improving the reliability of the device.

Figure 25:
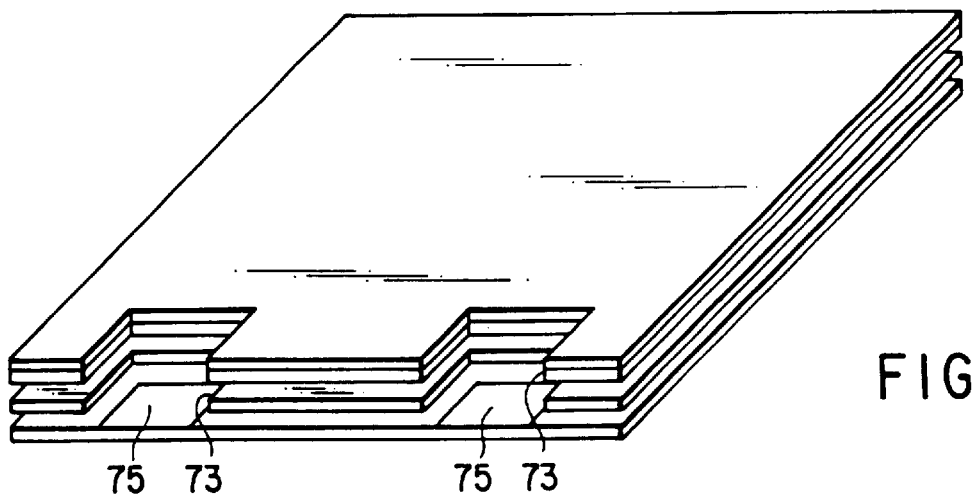

Thereafter, as shown in FIG. 25, a through-hole 73 is formed so as to expose the terminal formed on the outside of the coil pattern 53. If required, a pad metal 75 may be formed for the purpose of improving the bonding property of the terminal. Alternatively, at the occasion of forming the coil on the terminal, the terminal may be concurrently formed by means of plating.

According to the aforementioned manufacturing method, the lead-out electrode can be formed by means of a photo-etching method, so that an electrode which is finely partitioned into plural sections can be easily formed. As a result, it is possible to minimize the eddy current which may be generated in the vicinity of the pad, and to provide a magnetic device which is minimal in energy loss.

As explained above, according to the seventh embodiment of this invention, an opening is formed in the first magnetic film and the lead-out wiring of the pad is formed on the substrate, so that the area of the pad can be minimized and at the same time, the thickness of pad can be minimized. Further, since the pad is formed near the substrate, the lead-out wiring disposed inside the opening of the first magnetic film can be minimized in length. Further, since the area of pad can be minimized, the size of the planar coil can be also minimized.

Furthermore, since the lead-out wiring is partitioned by making use of a photoetching method, the direct current resistance of the lead-out wiring can be minimized.

As a result, it is possible to reduce the eddy current loss that may be generated at the central portion of the spiral coil, thus making it possible to provide a magnetic device having a high Q value.

Next, the manufacturing process of the magnetic film structure and of the magnetic device according to this invention will be explained with reference to the following various examples.

EXAMPLE 1

Figure 26A:
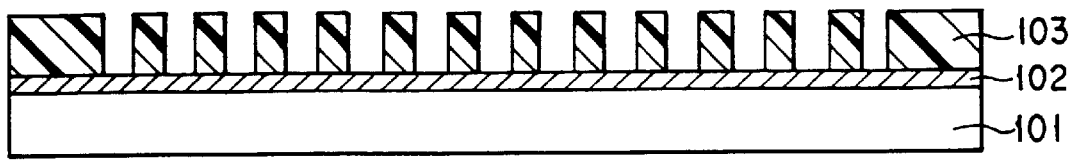
FIGS. 26A to 26C are cross-sectional views illustrating in stepwise the manufacturing process of the lower magnetic film structure.
Figure 26B:
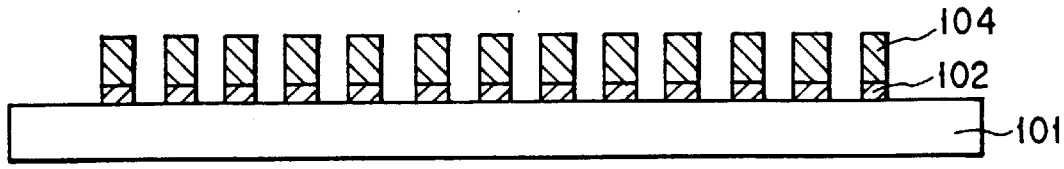
Figure 26C:
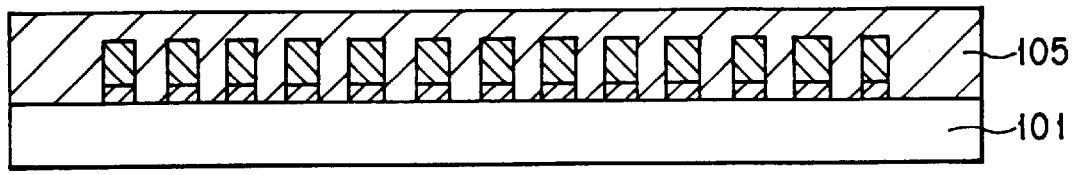

FIGS. 26A to 26C show cross-sectional views illustrating in stepwise the manufacturing process of the lower magnetic film structure.

First of all, as shown in FIG. 26A, a plating underlayer 102 is formed on the surface of a substrate 101 and then a plating frame 103 is formed thereon. The substrate 101 constitutes a base plate in the subsequent steps, and may be formed of a silicon wafer, a glass substrate, a ceramic substrate such as alumina wafer. Alternatively, the substrate may be formed of a non-magnetic sintered body such as a non-magnetic ferrite.

As for the plating underlayer 102 to be formed on the substrate 101, it may be formed of Cu or a laminate structure comprising an adhesive layer for improving the adhesivity between the substrate and Cu (for instance, Cu/Cr, Cu/Nb, etc.). The thickness of the plating underlayer 102 may be such that it can assure the conductivity thereof. For example, the plating underlayer 102 may be obtained by means of sputtering, thus forming Cu (0.1 to 1 µm)/Nb (0.1 to 1 µm).

As for the material for the plating frame 103 to be formed on the plating underlayer 102, a material which is capable of optionally forming a fine structure such as a resist may be preferably employed. When a resist is employed as the plating frame 103, it can be formed into any desired pattern by making use of a mask. In this case, the pattern should preferably be such that a slit can be formed therein so as to prevent an underlying structure from forming a continuous layer in the in-plane direction of the underlying structure.

Then, as shown in FIG. 26B, an underlying structure 104 is formed by means of an electrolytic plating method on the exposed portions of the plating underlayer 102. As for the material for the underlying structure 104, it is preferable to employ a material having a high melting point of not less than the sintering temperature of the ferrite paste or than the curing temperature of the binder. In particular, Cu, Cr, Ni or a composite material comprising a combination of any of these metals with P or B may be preferably employed. After the underlying structure 104 is formed, the plating frame 103 is removed.

The plating underlayer exposed as a result of the removal of the plating frame 103 should preferably be removed by means of wet etching, chemical dry etching (CDE) or milling in order to inhibit eddy current from being generated inside the underlying structure. For example, when Cu/Nb is employed as a plating underlayer, Cu can be removed by means of wet etching using an acid, while Nb can be removed by means of CDE.

Then, as shown in FIG. 26C, a magnetic body 105 is formed all over the upper surface of the resultant device thereby to obtain a magnetic film structure. The formation of the magnetic body 105 may be performed by a process wherein a paste containing ferrite dispersed in a solvent or a resin is entirely coated by means of a printing method or a spin coating method, and after the dispersion medium is removed, the coated layer is baked. The magnetic material to be employed in this case is not limited to ferrite, but may be a metallic magnetic substance or amorphous magnetic substance.

The aforementioned processes of coating, removing of dispersing agent and sintering should preferably be performed by repeating each process in several times in order to enable the surface of the magnetic body to become more flat. When the coating step is to be performed in several times, a paste having a low viscosity is initially employed so as to sufficiently fill the recessed portions formed between the underlying structures with the paste, and then a paste having a higher viscosity is employed, thus improving the smoothness of the surface of the resultant film.

Further, when a printing method is to be employed, the magnetic body can be formed into any desired configuration by making use of a screen pattern. Furthermore, it is also possible to form an underlying protective layer consisting of SiN, AlN or $Al_2O_3$ on the surface of the underlying structure 104.

EXAMPLE 2

FIGS. 27A to 27D show cross-sectional views illustrating in stepwise the manufacturing process of the lower magnetic film structure.

Figure 27A:
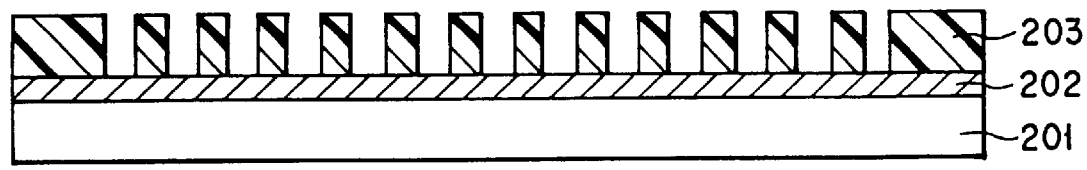
FIGS. 27A to 27D are cross-sectional views illustrating in stepwise the manufacturing process of the lower magnetic film structure.

First of all, as shown in FIG. 27A, a masking material 202 is formed on the surface of a substrate 201 and then a resist pattern 203 is formed thereon. The substrate 201 constitutes a base plate in the subsequent steps, and may be formed of a material which can be selectively etched, specific examples thereof being silicon wafer, a glass substrate, etc.

As for the masking material 202 to be formed on the substrate 201, it may be formed of a material which cannot be etched at the occasion selective etching of the substrate 201, specific examples thereof being Cu and Al. When an Si wafer or a glass substrate is etched by means of chemical dry etching (CDE), the employment of Cu or Al as the masking material 202 is preferable. The thickness of the masking material 202 may preferably be in the range of 0.1 to 10 µm, more preferable in the range of 1 to 3 µm in view of the strength and etching property as a masking material. After a resist is formed on the masking material 202, the resist is patterned thereby to obtain a resist pattern 203.

Figure 27B:
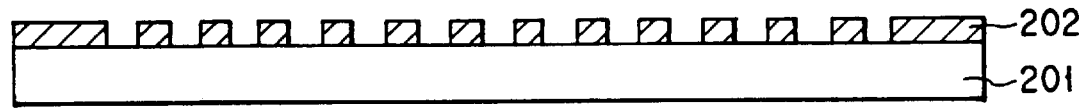

Then, as shown in FIG. 27B, by means of wet etching for instance, the masking material 202 is patterned with the resist pattern 203 being employed as a mask and then the resist pattern 203 is removed.

Figure 27C:
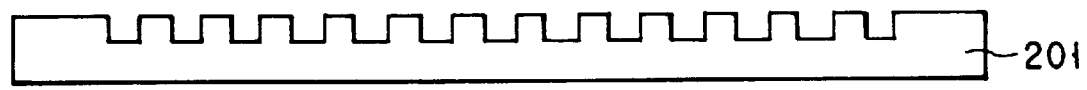

Then, as shown in FIG. 27C, the substrate 201 is selectively etched by means of reactive ion etching or chemical dry etching with the masking material 202 being employed as a mask. When the substrate 201 is formed of an Si wafer or a glass substrate, the employment of chemical dry etching employing $CF_4$ or $CCl_4$ as an etchant is preferable as an etching method. When an reactive ion etching is to be employed, the employment of a material exhibiting a difference in milling rate should preferably be employed as a masking material. After the substrate 201 is selectively etched, the masking material is etched away by means of wet etching, etc.

Figure 27D:
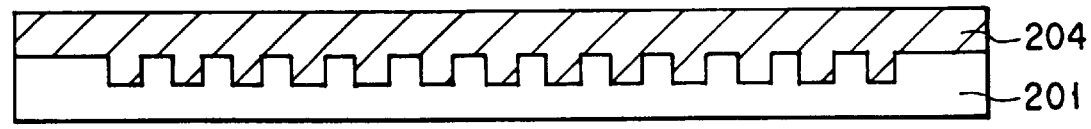

Then, as shown in FIG. 27D, a magnetic body 204 is formed all over the upper surface of the resultant device thereby to obtain a magnetic film structure. The formation of the magnetic body 204 may be performed by a process wherein a paste containing ferrite dispersed in a solvent or a resin is entirely coated by means of a printing method or a spin coating method, and after the dispersion medium is removed, the coated layer is sintered. The magnetic material to be employed in this case is not limited to ferrite, but may be a metallic magnetic substance or amorphous magnetic substance.

The aforementioned processes of coating, removing of dispersing agent and sintering should preferably be performed by repeating each process in several times in order to enable the surface of the magnetic body to become more flat. When the coating step is to be performed in several times, a paste having a low viscosity is initially employed so as to sufficiently fill the recessed portions of the substrate 201 with the paste, and then a paste having a higher viscosity is employed, thus improving the smoothness of the surface of the resultant film.

Further, when a printing method is to be employed, the magnetic body can be formed into any desired configuration by making use of a screen pattern. Furthermore, it is also possible to form an underlying protective layer consisting of SiN, AlN or $Al_2O_3$ on the surface of the underlying structure 104.

EXAMPLE 3

This example illustrates another example of manufacturing process of a lower magnetic film structure wherein a recessed and projected portion is directly formed on the surface of a substrate.

First of all, a machine working such as a blade cutting work is directly applied to the surface of an underlying substrate such as a silicon wafer, a glass substrate or a ceramic substrate thereby to form a recessed and projected portion on the surface of substrate. Alternatively, a green sheet may be printed into a pattern on a substrate by means of a screen printing method, the printed pattern being subsequently sintered thereby to form a recessed and projected portion on the surface of substrate. Alternatively, a ceramic paste may be applied on the surface of substrate by means of an injection method, the layer thus formed being subsequently sintered thereby to form a recessed and projected portion on the surface of substrate. As for the material for the underlying substrate, a metal such as zirconium and copper may be employed. However, since there is a possibility of these metallic materials being diffused into the magnetic film, the surface of the underlying substrate should preferably be covered with a diffusion preventive film such as $SiO_2$, SiN, AlN, $Al_2O_3$, etc.

EXAMPLE 4

One example of preparing a planar magnetic device by making use of the lower magnetic film structures which have been prepared by the manufacturing processes shown in the aforementioned Examples 1 to 3 will be explained with reference to FIGS. 28A to 28C.

Figure 28A:
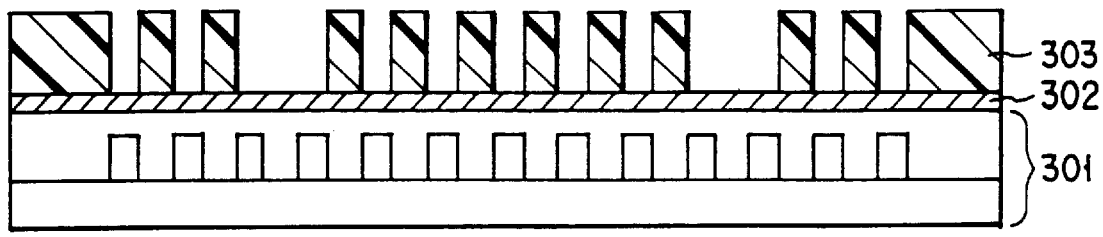
FIGS. 28A to 28C are cross-sectional views illustrating in stepwise the manufacturing process of the lower magnetic film structure.

The lower magnetic film structure 301 shown in FIG. 28A has been prepared according to the aforementioned Examples 1 to 3. A plating underlayer 302 for forming a coil is formed on the surface of this lower magnetic film structure 301. As for the plating underlayer 302, it may be formed of Cu, Cr, Nb, V or a laminate structure comprising an adhesive layer for improving the adhesivity between the substrate and Cu. (for instance, Cu/Cr, Cu/Nb, Cu/V, etc.). The thickness of the plating underlayer 302 may be such that it can assure the conductivity thereof. For example, the plating underlayer 302 may be obtained by means of sputtering, thus forming Cu (0.1 to 1 $\mu$m)/Nb (0.1 to 1 $\mu$m).

A plating frame 303 is formed on this plating underlayer 302. As for the material for the plating frame 303, a resist may be employed. An insulating film may be interposed between the lower magnetic film 301 and the plating underlayer 302. The insulating film can be formed by a process wherein $SiO_2$, SiN or AlN is deposited by means of vapor deposition method such as sputtering, or a glass paste containing glass dispersed therein is spin-coated at first, and then the deposited or coated layer is sintered to form the insulating film. Alternatively, an organic film may be employed for the insulating film, i.e. polyimide for instance may be coated and then heat-treated thereby to form the insulating film.

Figure 28B:
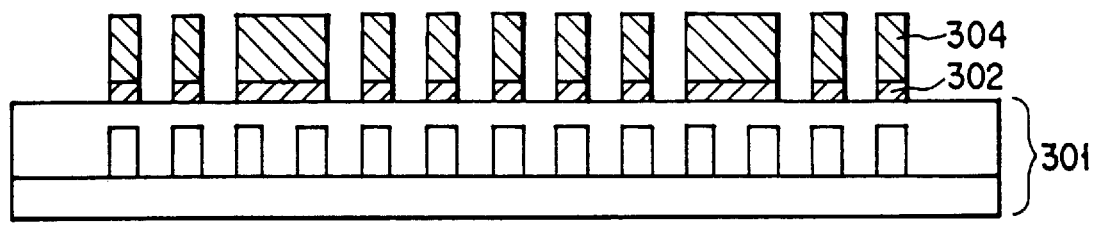

Then, as shown in FIG. 28B, a coil conductor 304 is formed by means of plating method and then the plating frame 303 is removed. Then, the exposed portions of the plating underlayer 302 are removed. As for the material for the coil conductor 304, it is preferable to employ a material which is low in specific resistance. In particular, Cu, Ag or an alloy containing these metals as a main component can be preferably employed as a material for the coil conductor 304.

The removal of the plating underlayer 302 may be performed by means of wet etching, chemical dry etching (CDE) or milling. For example, when Cu/Nb is employed as a plating underlayer 302, Cu can be removed by means of wet etching using an acid, while Nb can be removed by means of CDE.

The coil conductor may be prepared by means of a printing method employing a conductive paste. Alternatively, a conductive material coated all over the surface of substrate may be patterned by means of wet etching method employing an acid-resistive masking material such as $SiO_2$.

Figure 28C:
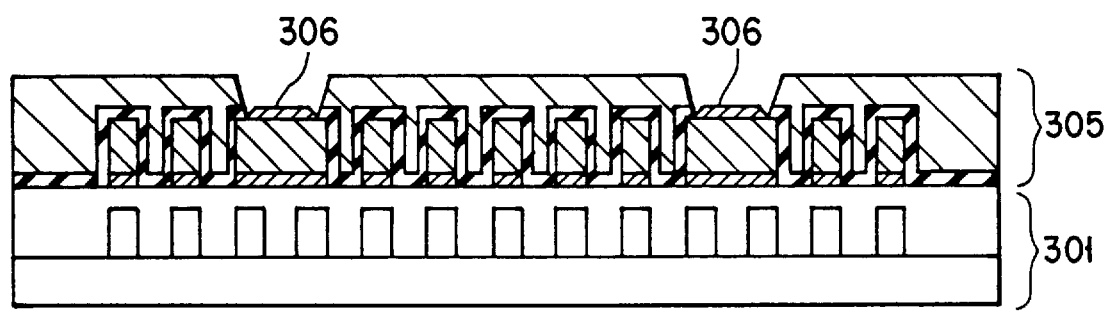

Then, as shown in FIG. 28C, an upper magnetic film structure 305 is formed by a method illustrated in the following Examples 5 to 8. Thereafter, a pad electrode 306 is formed. This pad electrode should be formed in such a manner that it provides an optimum metallic surface depending on the manner of contacting with an external component. For example, when a wire bonding is to be adopted, the outermost layer of the pad electrode 7 should be constituted by Al, Au or Cu. The underlying layer of the outermost layer may be constituted by a metal such as V or Mo.

EXAMPLE 5

FIGS. 29A to 29F show cross-sectional views illustrating in stepwise the manufacturing process of the upper magnetic film structure.

Figure 29A:
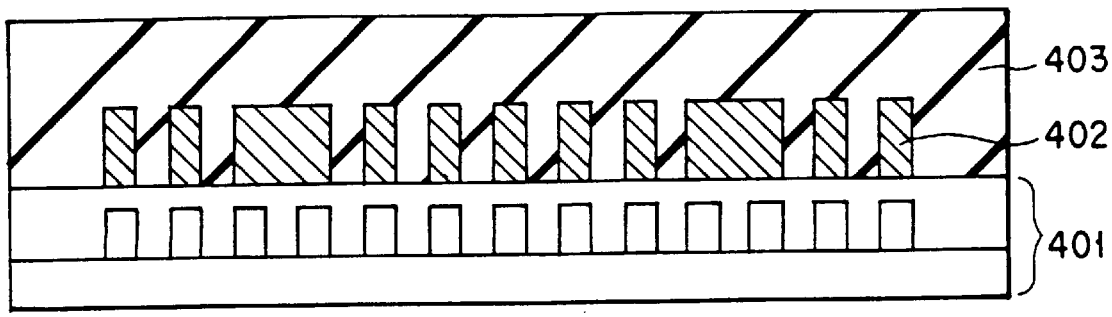
FIGS. 29A to 29F are cross-sectional views illustrating in stepwise the manufacturing process of the upper magnetic film structure.

First of all, as shown in FIG. 29A, a coil 402 is formed on the surface of a lower magnetic film structure 401 and then a paste containing glass dispersed therein is coated thereon by means of spin-coating or printing method, and after the dispersion medium is removed, the coated layer is sintered thereby to obtain an insulating film such as an $SiO_2$ film 403. The aforementioned processes of coating, removing of dispersing agent and sintering should preferably be performed by repeating each process in several times in order to enable the surface of the $SiO_2$ film 403 to become more flat. When the coating step is to be performed in several times, a paste having a low viscosity is initially employed so as to sufficiently fill the recessed portions of the coil conductor 402 with the paste, and then a paste having a higher viscosity is employed, thus improving the smoothness of the surface of the resultant film.

Further, when a printing method is to be employed, the $SiO_2$ film 403 can be formed into any desired configuration by making use of a screen pattern, so that an opening for the pad portion should preferably be formed at the occasion of forming a coated layer of the $SiO_2$ film 403.

Figure 29B:
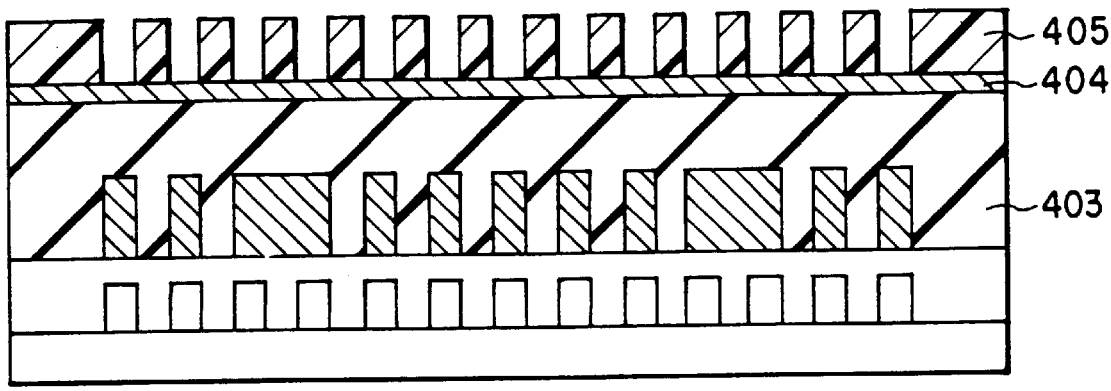

Then, as shown in FIG. 29B, for the purpose of forming a recessed and projected portion on the surface of the $SiO_2$ film 403, a masking material 404 such as Cu and Al, which cannot be etched at the occasion selective etching of the $SiO_2$ film 403 is formed. The thickness of the masking material 404 may preferably be in the range of 0.1 to 10 $\mu$m, more preferable in the range of 1 to 3 $\mu$m in view of the strength and etching property as a masking material. Then, a resist pattern 405 is formed on the masking material 404.

Figure 29C:
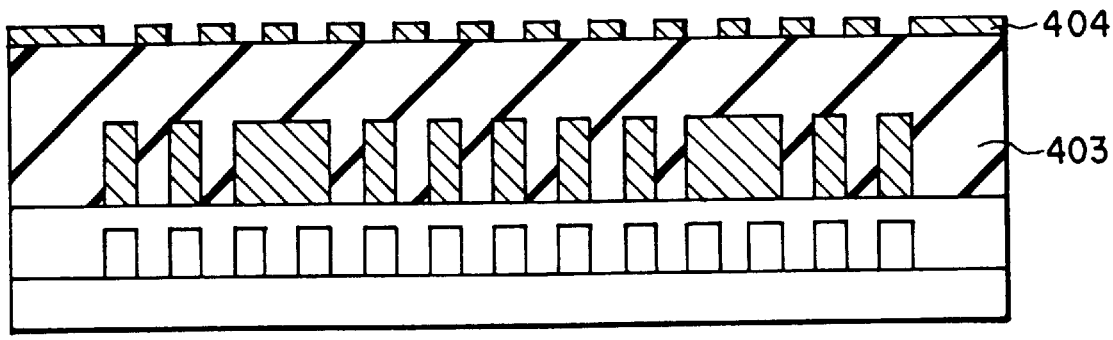

After the resist pattern 405 is formed in this manner, the masking material 404 is patterned by means of wet etching method with the resist pattern 405 being employed as a mask as shown in FIG. 29C.

Figure 29D:
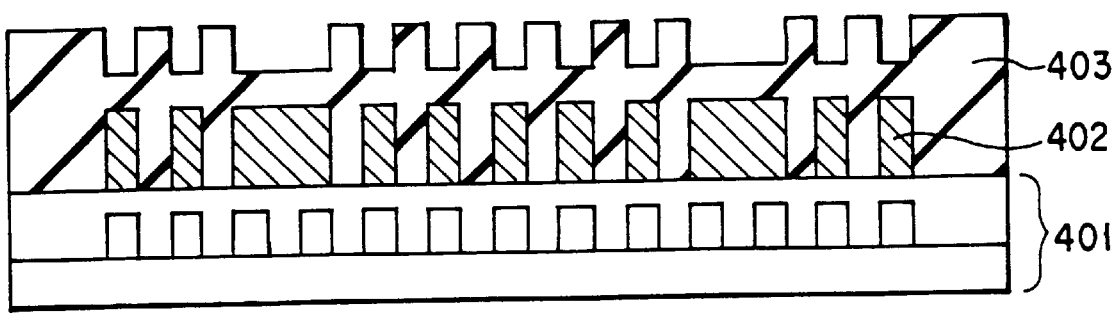

Then, as shown in FIG. 29D, the $SiO_2$ film 403 is selectively etched by means of reactive ion etching or chemical dry etching with the patterned masking material 404 being employed as a mask. The employment of chemical dry etching employing $CF_4$ or $CCl_4$ as an etchant is preferable as an etching method. When an ion milling is to be employed, the employment of a material exhibiting a difference in milling rate should preferably be employed as a masking material. Thereafter, the masking material is etched away by means of wet etching, etc.

Figure 29E:
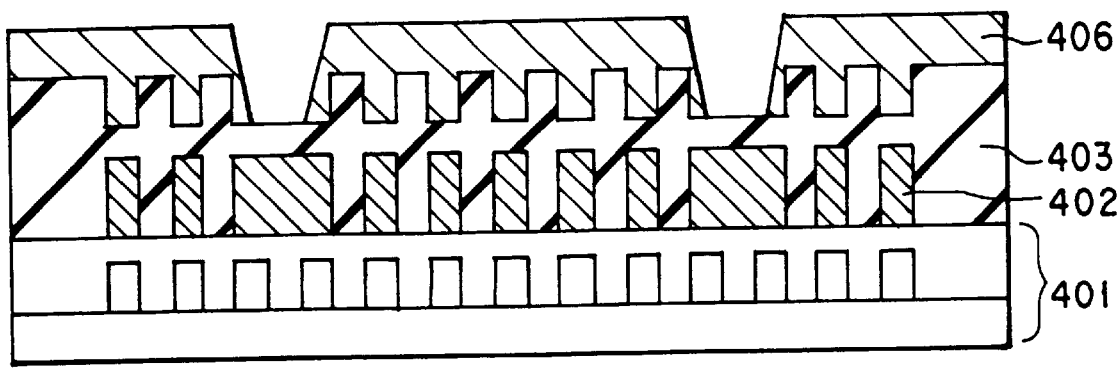

Then, as shown in FIG. 29E, a magnetic film 406 is formed. The formation of the magnetic film 406 may be performed by a process wherein a paste containing ferrite dispersed in a solvent or a resin is coated by means of a printing method, and after the dispersion medium is removed, the coated layer is sintered. In this case, the magnetic film is formed, by making use of a screen pattern, into a pattern wherein the pad portion is opened simultaneously.

The aforementioned processes of coating, removing of dispersing agent and sintering should preferably be performed by repeating each process in several times in order to enable the surface of the magnetic film 406 to become more flat. When the coating step is to be performed in several times, a paste having a low viscosity is initially employed so as to sufficiently fill the recessed portions of $SiO_2$ film with the paste, and then a paste having a higher viscosity is employed, thus improving the smoothness of the surface of the resultant film.

Figure 29F:
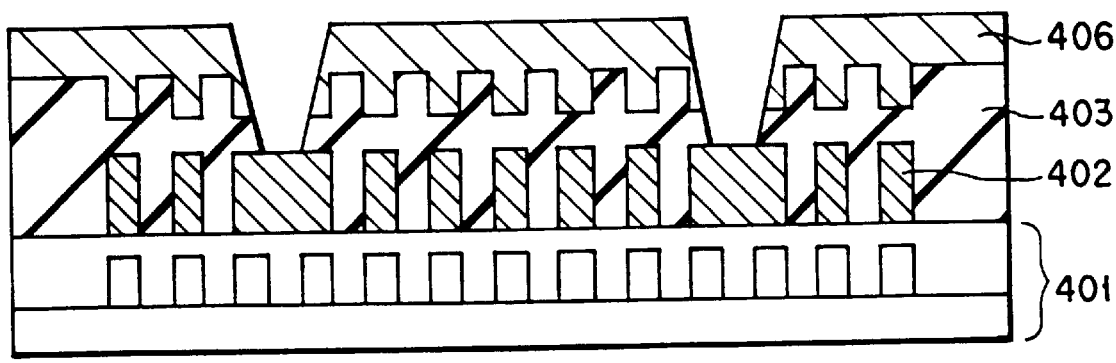

Subsequently, as shown in FIG. 29F, the exposed portions of $SiO_2$ are selectively etched with the masking material 404 being employed as a mask, thereby exposing the coil 402 and obtaining an upper magnetic film structure. As for the etching method to be employed in this case, reactive ion etching, chemical dry etching or milling may be employed. However, the employment of chemical dry etching employing $CF_4$ or $CCl_4$ as an etchant is particularly preferable as an etching method. The working of the pad opening may be performed by means of etching employing a resist or a masking material (such as Al, Cu, etc.).

EXAMPLE 6

FIGS. 30A to 30D show cross-sectional views illustrating in stepwise another manufacturing process of the upper magnetic film structure.

Figure 30A:
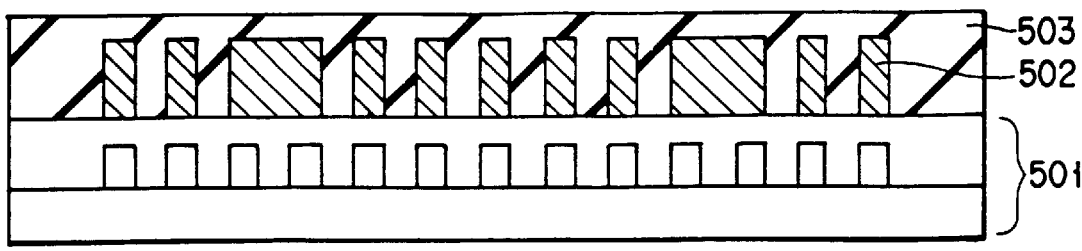
FIGS. 30A to 30D are cross-sectional views illustrating in stepwise another manufacturing process of the upper magnetic film structure.

First of all, as shown in FIG. 30A, a coil conductor 502 is formed on the surface of a lower magnetic film structure 501 and then a paste containing glass dispersed therein is coated thereon by means of spin-coating or printing method, and after the dispersion medium is removed, the coated layer is sintered thereby to obtain an insulating film such as an insulating film 503. The aforementioned processes of coating, removing of dispersing agent and sintering should preferably be performed by repeating each process in several times in order to enable the surface of the insulating film 503 to become more flat. When the coating step is to be performed in several times, a paste having a low viscosity is initially employed so as to sufficiently fill the recessed portions of the coil conductor 502 with the paste, and then a paste having a higher viscosity is employed, thus improving the smoothness of the surface of the resultant film.

Further, when a printing method is to be employed, the insulating film 503 can be formed into any desired configuration by making use of a screen pattern, so that an opening for the pad portion should preferably be formed at the occasion of forming a coated layer of the insulating film 503. By the way, if a green sheet is to be employed, it should be formed by making use of a printing method so as to secure the opening portion of the pad.

Then, a glass paste, a green sheet, etc. is printed into a pattern by means of a screen printing method, and then the resultant patterned layer is sintered to form a projected structure 504. Alternatively, this projected structure 504 may be formed by injecting a ceramic paste onto the surface of substrate and then by sintering the ceramic paste.

Figure 30B:
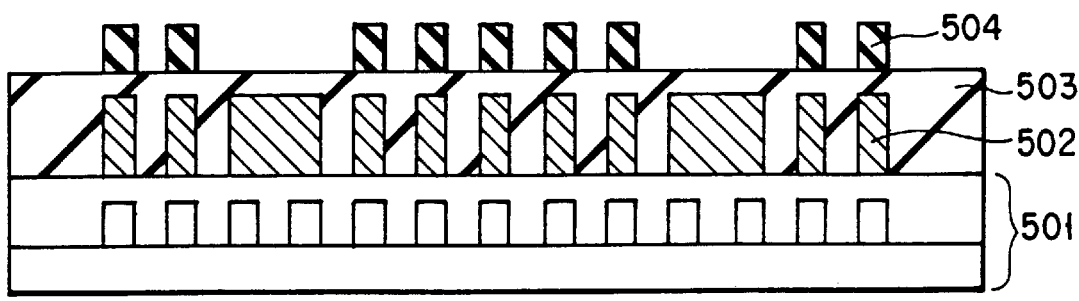
Figure 30C:
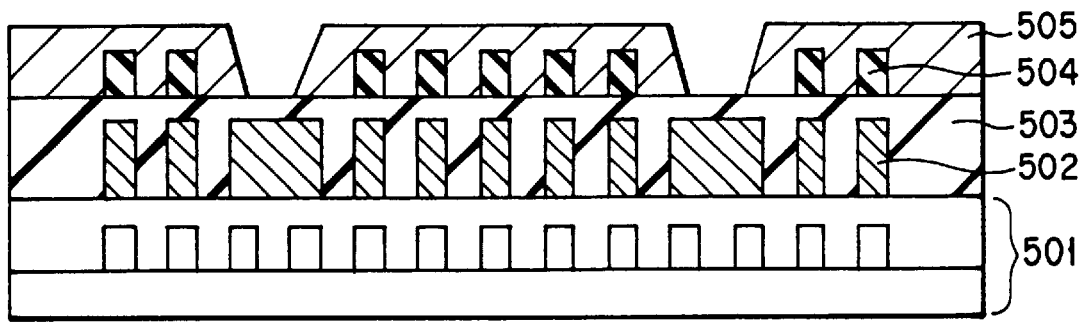
Figure 30D:
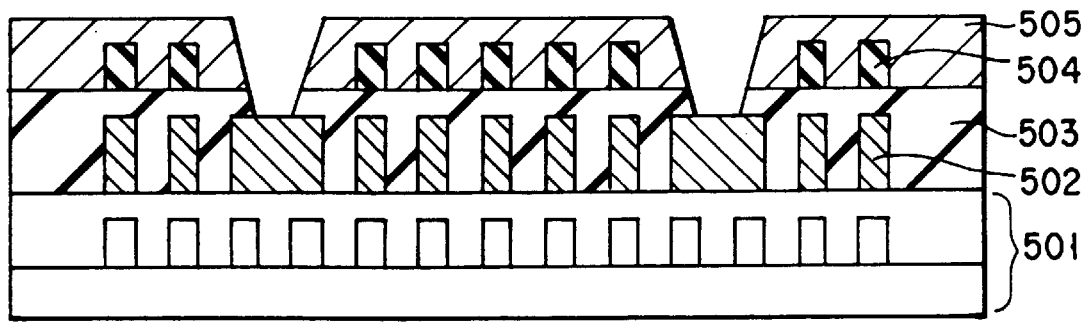

Thereafter, as shown in FIG. 30B, a magnetic film 505 is formed. The formation of the magnetic film 505 may be performed by a process wherein a paste containing ferrite dispersed in a solvent or a resin is coated by means of a printing method, and after the dispersion medium is removed, the coated layer is sintered. In this case, the magnetic film is formed, by making use of a screen pattern, into a pattern wherein the pad portion is opened simultaneously.

The aforementioned processes of coating, removing of dispersing agent and sintering should preferably be performed by repeating each process in several times in order to enable the surface of the magnetic film 505 to become more flat. When the coating step is to be performed in several times, a paste having a low viscosity is initially employed so as to sufficiently fill the recessed portions formed between the projected structures 504 with the paste, and then a paste having a higher viscosity is employed, thus improving the smoothness of the surface of the resultant film.

Subsequently, the exposed portions of insulating film are selectively etched with the masking material 505 being employed as a mask, thereby obtaining an upper magnetic film structure. As for the etching method to be employed when the insulating film is formed with glass, reactive ion etching, chemical dry etching or milling may be employed. However, the employment of chemical dry etching employing $CF_4$ or $CCl_4$ as an etchant is particularly preferable as an etching method. The working of the pad opening may be performed by means of etching employing a resist or a masking material (such as Al, Cu, etc.).

EXAMPLE 7

Figure 31A:
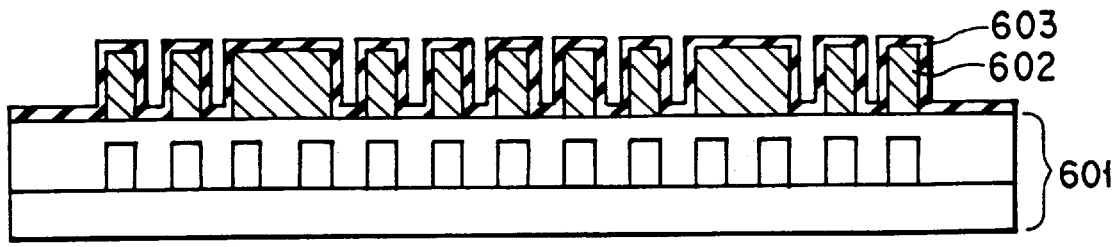
FIGS. 31A to 31C are cross-sectional views illustrating in stepwise another manufacturing process of the upper magnetic film structure.
Figure 31B:
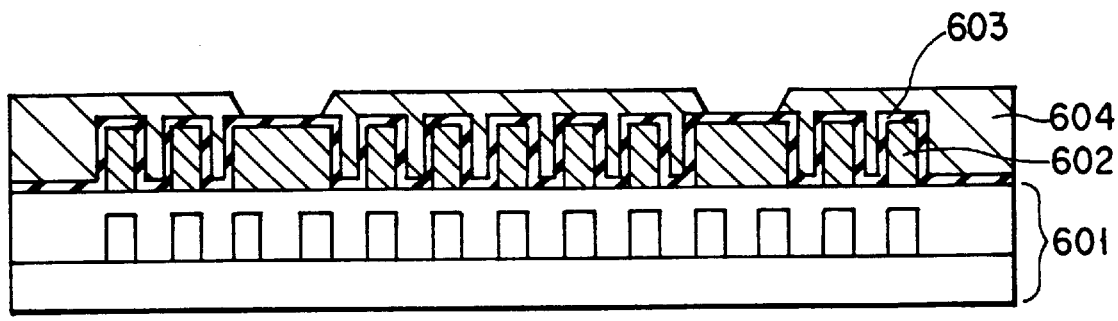
Figure 31C:
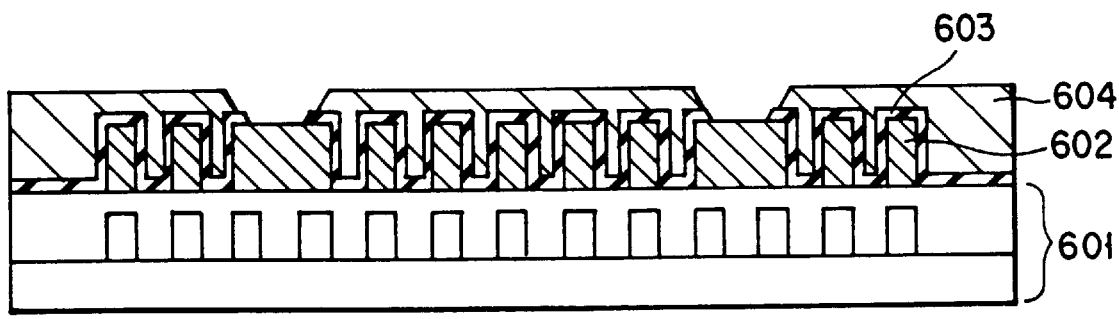

FIGS. 31A to 31C show cross-sectional views illustrating in stepwise another manufacturing process of the upper magnetic film structure.

First of all, as shown in FIG. 31A, a coil conductor 602 is formed on the surface of a lower magnetic film structure 601 and then an insulating film 603 is formed. As for the material for the insulating film 603, SiN, AlN, etc. can be preferably employed.

Thereafter, as shown in FIG. 31B, a magnetic film 604 is formed. The formation of the magnetic film 604 may be performed by a process wherein a paste containing ferrite dispersed in a solvent or a resin is coated by means of a printing method, and after the dispersion medium is removed, the coated layer is sintered. In this case, the magnetic film is formed, by making use of a screen pattern, into a pattern wherein the pad portion is opened simultaneously.

The aforementioned processes of coating, removing of dispersing agent and sintering should preferably be performed by repeating each process in several times in order to enable the surface of the magnetic film 604 to become more flat. When the coating step is to be performed in several times, a paste having a low viscosity is initially employed so as to sufficiently fill the recessed portions of the insulating film 603 with the paste, and then a paste having a higher viscosity is employed, thus improving the smoothness of the surface of the resultant film.

Subsequently, as shown in FIG. 31C, the exposed portions of insulating film 603 are selectively etched with the magnetic film 604 being employed as a mask, thereby obtaining an upper magnetic film structure. As for the etching method to be employed when the insulating film 603 is formed with SiN, reactive ion etching, chemical dry etching or milling may be employed. However, the employment of chemical dry etching employing $CF_4$ or $CCl_4$ as an etchant is particularly preferable as an etching method. On the other hand, when the insulating film 603 is formed with AlN, a wet etching method employing an alkaline solution can be preferably employed as an etching method. In any cases, the etching can be performed by making use of a resist or a masking material (when the insulating film is formed of SiN, Al or Cu can be employed; while when the insulating film is formed of AlN, Cu can be employed), or by making use of a magnetic film as a mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A planar magnetic device comprising:
   a substrate provided on one main surface thereof with a groove-like recessed portion and with a ridge-like projected portion located neighboring to said groove-like recessed portion;
   a first ferrite magnetic film formed on one main surface of the substrate and exhibiting a magnetic anisotropy; and
   a planar coil conductor formed on the ferrite magnetic film.

2. The planar magnetic device according to claim 1, which further comprises a second ferrite magnetic film formed on the planar coil conductor and exhibiting a magnetic anisotropy.

3. The planar magnetic device according to claim 1, wherein said first ferrite magnetic film has a substantially flat upper surface.

4. The planar magnetic device according to claim 1, wherein said groove-like recessed portion and said ridge-like projected portion are both spiral in shape.

5. The planar magnetic device according to claim 1, wherein said groove-like recessed portion and said ridge-like projected portion are both concentric in shape.

6. The planar magnetic device according to claim 1, wherein at least surface portion of said substrate is formed of a metal selected from the group consisting of zirconium, copper and aluminum, and one main surface of said substrate is covered with a metal diffusion preventive film.

7. The planar magnetic device according to claim 1, wherein said substrate is formed of insulating substance selected from the group consisting of SiN and $SiO_2$.

8. A planar magnetic device comprising:
   a substrate;
   a magnetic film formed on one main surface of the substrate and exhibiting a magnetic anisotropy; and
   a planar coil conductor formed on said magnetic film,
   wherein said magnetic film is provided with uniaxial magnetic anisotropy in an inline direction of said substrate so as to allow an extending direction of said planar coil conductor to be maintained parallel with easy direction of magnetization.

9. A hybrid integrated circuit comprising:
   a circuit board;
   a semiconductor chip mounted on said circuit board; and
   an inductor mounted on said circuit board and including
      a substrate provided on one main surface thereof with a groove-like recessed portion and with a ridge-like projected portion located neighboring to said groove-like recessed portion;
      a ferrite magnetic film formed on one main surface of the substrate and exhibiting a magnetic anisotropy; and
      a planar coil conductor formed on the ferrite magnetic film,
   wherein said semiconductor chip and said inductor constitute an integrated circuit.

10. The hybrid integrated circuit according to claim 9, wherein said ferrite magnetic film has a substantially flat upper surface.

11. A hybrid integrated circuit comprising:
    a circuit board;
    a semiconductor chip mounted on said circuit board; and
    an inductor mounted on said circuit board and including
       a substrate;
       a magnetic film formed on one main surface of the substrate and exhibiting a magnetic anisotropy; and
       a planar coil conductor formed on said magnetic film,
    wherein said magnetic film is provided with uniaxial magnetic anisotropy in an in-line direction of said substrate so as to allow an extending direction of said planar coil conductor to be maintained parallel with easy direction of magnetization, and said semiconductor chip and said inductor constitute an integrated circuit.

12. The planar magnetic device according to claim 11, wherein said ferrite magnetic film has a substantially flat upper surface.

13. A hybrid integrated circuit comprising:
    a circuit board;
    a semiconductor chip mounted on a first portion of said circuit board; and
    an inductor mounted on a second portion of said circuit board,
    wherein said second portion of said substrate is provided on one main surface thereof with a groove-like recessed portion and with a ridge-like projected portion located neighboring to said groove-like recessed portion, and
    said inductor includes a ferrite magnetic film formed on said second portion of said substrate and exhibiting a magnetic anisotropy, and a planar coil conductor formed on the ferrite magnetic film.

14. A hybrid integrated circuit comprising:
    a circuit board;
    a semiconductor chip mounted on a first portion of said circuit board; and
    and inductor mounted on a second portion of said circuit board and including a ferrite magnetic film formed on said second portion of said substrate and exhibiting a magnetic anisotrophy, and a planar coil conductor formed on the ferrite magnetic film.

* * * * *